(12) United States Patent
Miki et al.

(10) Patent No.: US 8,815,472 B2
(45) Date of Patent: Aug. 26, 2014

(54) VOLUME HOLOGRAM OPTICAL RECORDING MEDIUM, COMPOSITION FOR VOLUME HOLOGRAM RECORDING LAYER FORMATION, AND VOLUME HOLOGRAM RECORDING MATERIAL

(75) Inventors: Yasuaki Miki, Yokohama (JP); Naomi Fujimori, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 452 days.

(21) Appl. No.: 12/447,313

(22) PCT Filed: Oct. 25, 2007

(86) PCT No.: PCT/JP2007/070823
§ 371 (c)(1),
(2), (4) Date: Apr. 27, 2009

(87) PCT Pub. No.: WO2008/050835
PCT Pub. Date: May 2, 2008

(65) Prior Publication Data
US 2010/0067073 A1   Mar. 18, 2010

(30) Foreign Application Priority Data

Oct. 25, 2006  (JP) .................................. 2006-290539
Oct. 27, 2006  (JP) .................................. 2006-293232

(51) Int. Cl.
| | |
|---|---|
| G03H 1/02 | (2006.01) |
| G03F 7/027 | (2006.01) |
| G03H 1/26 | (2006.01) |
| G03F 7/031 | (2006.01) |
| G03F 7/00 | (2006.01) |
| G03F 7/004 | (2006.01) |

(52) U.S. Cl.
CPC ..... G03H 1/2645 (2013.01); *G03H 2001/0264* (2013.01); *G03H 2240/24* (2013.01); *G03H 2260/12* (2013.01); *G03H 2260/31* (2013.01); G03F 7/027 (2013.01); *G03F 7/001* (2013.01); *G03F 7/0045* (2013.01); G03F 7/031 (2013.01)
USPC ...................................... 430/2; 430/1; 359/3

(58) Field of Classification Search
None
See application file for complete search history.

(56) References Cited

U.S. PATENT DOCUMENTS 3,046,127 A * 7/1962 Barney et al. .............. 430/281.1
3,551,235 A * 12/1970 Bassemir et al. ............... 156/99
(Continued)

FOREIGN PATENT DOCUMENTS

| | | |
|---|---|---|
| JP | 2 55446 | 2/1982 |
| JP | 59 152396 | 8/1984 |

(Continued)

OTHER PUBLICATIONS

Zlatanova et al., "Photoinduced changes inmethyl orange polyimide layers", Opt. Mater., vol. 5 pp. 279-283 (1996).*

(Continued)

*Primary Examiner* — Martin Angebranndt
(74) *Attorney, Agent, or Firm* — Oblon, Spivak, McClelland, Maier & Neustadt, L.L.P.

(57) ABSTRACT

This invention provides, for example, a highly stable and reliable volume hologram optical recording medium which can suppress an intensity variation, for example, in diffraction efficiency after signal recording and can stably develop a high S/N ratio. The volume hologram optical recording medium includes a recording layer containing at least one compound selected from compounds (A1) having a terpenoid structure, compounds (A2) represented by a formula (I), and cyclic or noncyclic compounds (A3) having at least two double bonds two of these double bonds are located at 1,4-position relatively, wherein R1 and R2 each independently represent an organic group having 1 to 20 carbon atoms, and R1 and R2 may combine to form a cyclic structure.

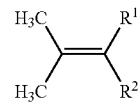

(I)

17 Claims, 3 Drawing Sheets

(56) References Cited

U.S. PATENT DOCUMENTS

| | | | |
|---|---|---|---|
| 3,658,526 A * | 4/1972 | Haugh | 430/1 |
| 4,088,811 A * | 5/1978 | Harris et al. | 526/89 |
| 4,590,287 A | 5/1986 | Riediker et al. | |
| 4,713,401 A | 12/1987 | Riediker et al. | |
| 4,855,468 A | 8/1989 | Riediker et al. | |
| 4,910,121 A | 3/1990 | Riediker et al. | |
| 4,962,012 A | 10/1990 | Riediker et al. | |
| 5,096,790 A * | 3/1992 | Monroe | 430/1 |
| 5,260,149 A * | 11/1993 | Monroe et al. | 430/1 |
| 5,693,721 A * | 12/1997 | Hentges et al. | 525/339 |
| 6,103,454 A | 8/2000 | Dhar et al. | |
| 6,482,551 B1 | 11/2002 | Dhar et al. | |
| 6,743,552 B2 | 6/2004 | Setthachayanon et al. | |
| 2002/0094485 A1 * | 7/2002 | Takebe | 430/7 |
| 2003/0044691 A1 | 3/2003 | Setthachayanon et al. | |
| 2003/0065047 A1 * | 4/2003 | Katou | 522/1 |
| 2005/0116381 A1 * | 6/2005 | Wong et al. | 264/236 |
| 2005/0226661 A1 * | 10/2005 | Ohmura et al. | 399/333 |
| 2006/0194120 A1 | 8/2006 | Cole et al. | |
| 2006/0194122 A1 * | 8/2006 | Takizawa | 430/1 |
| 2007/0184353 A1 | 8/2007 | Satou et al. | |
| 2007/0231744 A1 * | 10/2007 | Sasao et al. | 430/281.1 |

FOREIGN PATENT DOCUMENTS

| | | |
|---|---|---|
| JP | 61 151197 | 7/1986 |
| JP | 2 69 | 1/1990 |
| JP | 5 85784 | 4/1993 |
| JP | 5 241338 | 9/1993 |
| JP | 5-323850 | 12/1993 |
| JP | 2000 10277 | 1/2000 |
| JP | 2001 220526 | 8/2001 |
| JP | 2001 310937 | 11/2001 |
| JP | 2004 198446 | 7/2004 |
| JP | 2004 537620 | 12/2004 |
| JP | 3737306 | 1/2006 |
| JP | 2006 261629 | 9/2006 |
| JP | 2006 267596 | 10/2006 |
| WO | 2005 078532 | 8/2005 |
| WO | WO 2005/093493 A1 | 10/2005 |
| WO | 2005/124460 * | 12/2005 |
| WO | 2006 093846 | 9/2006 |
| WO | 2007/007436 * | 1/2007 |

OTHER PUBLICATIONS

Scientificpsychic website table (5 pages) (2005 copyright).*
Kim et al. "Effect of organic side chains on the diffraction efficiency . . . " Nanotechnol. vol. 17 pp. 2899-2906 (May 2006).*
Burgle et al., "Dampfung des Trommsdorf-effects bei der polymerisation von methylmethacrylat durch . . . " Angew. Makro. Chem. vol. 11 pp. 27-40 (1970).*
Extended European Search Report issued Dec. 23, 2010 in EP 07 83 0557.
Tsujiuchi, J., "Holographic Display", Sangyo Tosho, section 2, pp. 210-276 (1990) (with partial English translation).
Japanese Office Action issued Mar. 5, 2013, in Patent Application No. 2007-276350 (English-language translation only).

* cited by examiner

VOLUME HOLOGRAM OPTICAL RECORDING MEDIUM, COMPOSITION FOR VOLUME HOLOGRAM RECORDING LAYER FORMATION, AND VOLUME HOLOGRAM RECORDING MATERIAL

TECHNICAL FIELD

The present invention relates to a volume hologram optical recording medium and the like. More specifically, it relates to a volume hologram optical recording medium in which three-dimensional information is recordable by plural coherent light irradiation, and the like.

BACKGROUND ART

In recent years, in an effort aiming at an optical recording medium having a still larger recording capacity and density, a volume hologram optical recording medium has been developed, which records information as a hologram by changing the refractive index of a recording layer in accordance with an optical intensity distribution generated by the interference of light.

The general principle about forming a hologram is described in several technical documents or books (see Non-Patent Document 1). According to these, an object to be recorded is irradiated with one of two coherent laser beams of light, while a photosensitive hologram recording material is placed at the position where the laser beam is receivable.

A hologram recording material is irradiated with a direct coherent light which does not illuminate the object, in addition to a light from an object. The light from the object is called an object light, and the light that directly illuminates the recording material is called a reference light. Interference patterns between the reference light and the object light is recorded as image information. Then, when the recording material treated as above is irradiated with the same light (reproduction light) as the reference light, the light is diffracted by holograms in a manner that the wave surface of the reflected light, which has originally arrived at the recording material from the object in the recording step, is reproduced. As a result, an object image similar to the real image of the object is observable three-dimensionally.

A hologram formed by irradiating the hologram recording material with the reference light and object light from the same direction is called a transmission hologram, while a hologram formed by irradiating the recording material with the reference light and the object light from an opposite direction is called a reflection hologram. A hologram having a sufficient film thickness with respect to the spacing of the interference stripes (usually 5 times or more of the spacing of the interference stripes or a thickness of about 1 μm or more) is called a volume hologram. Recording with a higher density is attainable with a thicker film, because the recording is performed toward the film thickness direction.

An example of known recording materials for a volume phase hologram is a write-once type hologram that does not need wet processes or bleaching processes. The composition thereof is usually a resin matrix with a photoactive compound incorporated. Examples thereof include a photopolymer system that is a combination of a resin matrix and radical or cation polymerizable monomers (see Patent Document 1).

Upon recording information, when the recording layer is irradiated with the object light and reference light, interference patterns consisting of light portions and dark portions are formed in the recording layer. For example, when the photoactive compound is a radical polymerizable compound, a photo-radical polymerization initiator absorbs light and changes into a radical active species in the light portions. This radical active species causes addition reaction with neighboring radical polymerizable compounds, and the resultant addition reaction product changes into a radical active species. Further, this addition reaction product that changes into a radical active species causes addition reaction with neighboring radical polymerizable compounds. The polymer of the light portions is formed in the recording layer by repeating this series of photo polymerization reaction.

On the other hand, with the advancement of the polymerization reaction in the light portions, a concentration gradient of radical polymerizable compounds develops. The radical polymerizable compounds in the dark portions of the recording layer move by diffusion to the light portions. In contrast, other components in the light portions move by diffusion to the dark portions. Whereby, the light portions and dark portions in the interference patterns become to be composed of different compounds from each other, so that the light portions and dark portions exhibit different refractive indexes from each other.

As a result, the volume hologram optical recording medium keeps this refractive index difference as information. As the refractive index difference is larger, a larger diffraction efficiency is obtained. Therefore, in order to develop a difference in the refractive index, attempts have been made to use a compound having an aromatic ring, a heterocyclic ring, chlorine, bromine or the like for either one of the resin matrix or monomers.

The photopolymer system is generally composed of a basic composition including a resin matrix, a photoactive compound, and a photo polymerization initiator, and is a practical and promising system having a capability of satisfying both of a high diffraction efficiency and a dry process treatment. However, a system having the optimal sensitivity upon recording, a sufficient diffraction efficiency, a high S/N ratio and a high multiplicity has been requested, and a system exhibiting the excellent performances in the stability of signal recording and reliability has been also desired. To meet the requests, various attempts have been made on the formulation of a composition for recording or the method of producing the medium.

For example, in Patent Document 2, a chain transfer agent or a polymerization inhibitor is used. The examples of Patent Document 2 describe the addition of a compound that is generally called as a chain transfer agent or a polymerization retardant, represented by phenols, allyl compounds, and amine compounds.

However, although influences were attained on the retardation of photo reaction and the extension of induction period before polymerization starts by the addition of these compounds, effects on the suppression of temporal change of recorded signals and on the improvement of S/N ratio were not sufficient.

Patent Document 3 describes that 2,6-di-tert-butyl-4-methylphenol (BHT) is added in a volume hologram recording medium.

BHT is considered to be added with an expectation of allowing it to serve as an agent for polymerization retardation and chain transfer. However, any effect on the variation of signal intensity and the stability and reliability of the medium is not described.

Patent Document 4 describes a system of adding a tertiary amine in a volume hologram recording medium. The reason why the tertiary amine is added is not clearly described, but Patent Document 4 describes that the sensitivity and recording quality can be improved.

However, there is no specific description about signal quality or the like. In addition, it is concerned that the durability of the medium is decreased because amines are added to the medium composition.

Patent Document 5 describes a volume hologram recording medium having an oxygen permeation layer.

Patent Document 5 describes that the recording quality is improved and a medium having an excellent multiple recording performance is obtained because oxygen that penetrates into the medium terminates radical polymerization reaction.

However, oxygen does not easily penetrate into the medium uniformly so that the effect is often not exerted. In addition, it is concerned that the oxygen and moisture that penetrate into the medium shorten the life of the medium, so that the expected effect is considered not to be exerted sufficiently.

Non-patent document 1: "HOLOGRAPHIC DISPLAY", section 2, written by Junpei Tujiuchi, published by Sangyo Tosho Patent document 1: Japanese Patent No. 3737306

Patent document 2: International Publication No. WO 2006/093846, brochure

Patent document 3: Published Japanese Translation of a PCT Patent Application No. 2004-537620

Patent document 4: International Publication No. WO 2005/078532, brochure

Patent document 5: Japanese Patent Application Laid Open Publication No. 2006-267596

DISCLOSURE OF THE INVENTION

Problems to be Solved by the Invention

In a hologram recording medium using a photopolymer composition, a hologram is recorded based on the polymerization of a photoactive compound.

Therefore, an adequate controlling of the photo polymerization reaction is considered to contribute to the improvement of the signal recording quality. The examples described above may be regarded as examples of the attempts including the addition of a compound that is considered to have a capability of controlling the polymerization reaction. The aforementioned examples describe the addition of a compound that is generally called as a chain transfer agent or a polymerization retarding agent represented by phenols, mercapto compounds, allyl compounds, and amine compounds. Although influences were attained on the retardation of photo reaction and the extension of induction period until polymerization starts by the addition of these compounds, effects on the suppression of temporal change of recorded signals and on the improvement of S/N ratio were not sufficient.

Although many attempts have been made to control photo reactions when a hologram recording medium is irradiated with a light beam, sufficient effects have not been attained at present only by adding a general purpose agent called as a polymerization inhibitor, a chain transfer agent, or a polymerization controlling agent.

In particular, it is rather difficult to say that the temporal change of the diffraction efficiency that is caused by a so-called dark reaction, that is, a reaction that proceeds in a portion other than the light portions or a reaction that continues after the light irradiation, has been sufficiently controlled or suppressed. The temporal change of a diffraction efficiency once recorded brings about lowering in the reliability of signal recording or prevents efficient use of the photoactive compound.

The present invention has been made in view of the above circumstances.

Namely, it is an object of the present invention to provide a volume hologram optical recording medium that suppresses variations of intensities of diffraction efficiency or the like after signal recording, provides a high S/N ratio stably, and has excellent stability and reliability, by selecting the ratio of the diffraction efficiencies after signal recording within an adequate range.

It is another object of the present invention to provide a composition for volume hologram recording layer formation for use in the volume hologram optical recording medium.

It is also another object of the present invention to provide a volume hologram recording material for use in the volume hologram optical recording medium.

Means for Solving the Problems

The present inventors have made intensive studies to address the above problems and found that a volume hologram optical recording medium or the like that suppresses variations of intensities of recorded signals or the like, provides a high S/N ratio stably, and has excellent stability and reliability is attained when the ratio R1 of the diffraction efficiency five minutes after recording to the diffraction efficiency one minute after recording is in the range of 4 or less.

According to the studies of the present inventors, it has been found that especially a compound containing at least one structure selected from a compound (A1) having a terpenoid structure, a compound (A2) represented by the formula (I) described later, and a cyclic or non-cyclic compound (A3) having at least two double bonds, two of these double bonds being present at 1 and 4 positions relatively, prevents the dark reaction and suppresses the progress of polymerization adequately, resulting in the ratio of the diffraction efficiencies R1 in the range of 4 or less. Therefore, it is considered that a recording medium with an improved bit error rate and a high recording quality is obtained because only an irradiated portion reacts while a non-irradiated portion does not react upon irradiation for recording. In addition, the dynamic range for recording is allowed to expand because the wasteful consumption of the photoactive compound in the non-irradiated portion is suppressed, so that the change of the diffraction efficiency after records are written is allowed to be suppressed. Whereby, it is considered that a high S/N ratio and enhancement in the stability and reliability of recording may be provided.

[Chemical formula I]

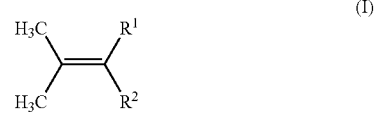

(In the formula (I), $R^1$ and $R^2$ each represent an organic group having 1 to 20 carbon atoms, and $R^1$ and $R^2$ may combine to form a ring structure.)

Specifically, according to an aspect of the present invention, there is provided a volume hologram optical recording medium providing a ratio R1 of diffraction efficiency five minutes after recording to diffraction efficiency one minute after the recording in a range of 4 or less upon volume hologram optical recording.

It is preferable that the ratio R1 of the diffraction efficiencies is in a range of 0.1 or more and 4 or less.

Further, it is preferable that a ratio R2 of diffraction efficiency one day after recording to the diffraction efficiency one minute after the recording is in a range of 0.1 or more and 5 or less, and more preferably, a range of 0.7 or more and 4 or less.

Furthermore, it is preferable that a recording layer of the volume hologram optical recording medium includes at least one compound selected from a compound (A1) having a terpenoid structure; a compound (A2) represented by a formula (I); and a cyclic or non-cyclic compound (A3) having at least two double bonds and two of these double bonds being present at 1 and 4 positions relatively.

[Chemical formula 2]

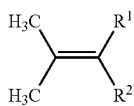

(I)

(In the formula (I), $R^1$ and $R^2$ each represent an organic group having 1 to 20 carbon atoms, and $R^1$ and $R^2$ may combine to form a ring structure.)

Still furthermore, it is preferable that the compound (A1) having a terpenoid structure is selected from terpinolene, α-terpinene, β-terpinene, and γ-terpinene.

Still furthermore, it is preferable that the cyclic or non-cyclic compound (A3) having at least two double bonds and two of these double bonds being present at 1 and 4 positions relatively is selected from 1,4-cyclohexadiene, 1,4-cycloheptadiene, linoleic acid or the derivatives thereof, and linolenic acid or the derivatives thereof.

According to another aspect of the present invention, there is provided a composition for volume hologram recording layer formation for use in a volume hologram optical recording medium including: a polymerizable photoactive compound (B) included in a system capable of forming an optical image; and at least one compound that is added to the system, and that is selected from a compound (A1) having a terpenoid structure, a compound (A2) represented by a formula (I) described below; and a cyclic or non-cyclic compound (A3) having at least two double bonds, two of these double bonds being present at 1 and 4 positions relatively.

[Chemical formula 3]

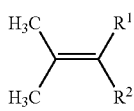

(I)

(In the formula (I), $R^1$ and $R^2$ each represent an organic group having 1 to 20 carbon atoms, and $R^1$ and $R^2$ may combine to form a ring structure.)

It is preferable that the compound (A1) having a terpenoid structure is selected from terpinolene, α-terpinene, β-terpinene, and γ-terpinene. Further, it is preferable that the cyclic or non-cyclic compound (A3) having at least two double bonds and two of these double bonds being present at 1 and 4 positions relatively is selected from 1,4-cyclohexadiene, and 1,4-cycloheptadiene.

Furthermore, it is preferable that the composition for the volume hologram recording layer formation further includes: a resin matrix (C); and a photopolymerization initiator (D). Still furthermore, it is preferable that the polymerizable photoactive compound (B) is a radical polymerizable monomer.

According to further aspect of the present invention, there is provided a volume hologram recording material including the above-mentioned composition for the volume hologram recording layer formation.

According to furthermore aspect of the present invention, there is provided a volume hologram optical recording medium including a layer including the above-mentioned volume hologram recording material.

Advantages of the Invention

According to the present invention, it is possible to provide a volume hologram optical recording medium that suppresses variations of intensities of diffraction efficiency or the like after signal recording, provides a high S/N ratio stably, and has excellent stability and reliability, and the like.

BEST MODE FOR CARRYING OUT THE INVENTION

Hereinafter, exemplary embodiments of the present invention will be described in detail. Note that the following description is an example (an illustrative example) of the exemplary embodiments of the present invention. The present invention is not limited to the following exemplary embodiments as long as it does not deviate from the gist thereof.

A volume hologram optical recording medium according to the present exemplary embodiments, upon volume hologram optical recording, has a ratio R1 of the diffraction efficiency five minutes after recording to the diffraction efficiency one minute after recording in the range of 4 or less, preferably 0.1 or more and 4 or less, more preferably 0.3 or more and 3 or less, and still more preferably 0.3 or more and 2 or less.

The diffraction efficiency is a value that is given in terms of a ratio of the diffracted light intensity to the incident light intensity when a recorded diffraction grating is irradiated with a light beam.

The ratio R1 of the diffraction efficiencies used in the present exemplary embodiments was calculated from the diffraction efficiency one minute after recording (D/E$_{1min}$) and the diffraction efficiency five minutes after recording (D/E$_{5min}$) in accordance with an equation R1=(D/E$_{5min}$)/(D/E$_{1min}$). When R1 is excessively larger than 4, the temporal change of recorded signals is large and the S/N ratio becomes low, whereby the stability and reliability of recording are lowered.

Further, the volume hologram optical recording medium of the present exemplary embodiments, upon volume hologram optical recording, has a ratio R2 of the diffraction efficiency one day after recording to the diffraction efficiency one minute after recording in the range of 0.1 or more and 5 or less, more preferably 0.3 or more and 4 or less, and still more preferably 0.3 or more and 3 or less.

The ratio R2 of the diffraction efficiencies used in the present exemplary embodiments was calculated from the diffraction efficiency one minute after recording (D/E$_{1min}$) and the diffraction efficiency one day after recording (D/E$_{1day}$) in accordance with an equation R2=(D/E$_{1day}$)/(D/E$_{1min}$). When R2 is excessively larger than 5, the temporal change of recorded signals is large and the S/N ratio becomes low, whereby the stability and reliability of recording are lowered.

In order to reduce the temporal change of the diffraction efficiency and keep the values of R1 and R2 in a predetermined range, plural factors are considered to be regulated.

That is, the suppression of the variation of the diffraction efficiency after recording is not necessarily achieved only by suppressing the dark reaction. Even though the dark reaction is suppressed, when a polymer that is formed by polymerizing polymerizable monomers through photo reaction diffuses in a matrix or decomposes, the diffraction efficiency may eventually vary in some cases. As the result of placing more importance on the suppression effect on the dark reaction, lowering in polymerization ability of the monomer, remarkable degradation of recording sensitivity or the like may be introduced. Just using generally called polymerization retardants or chain transfer agents will not assure better results.

On the easiness of diffusion of the polymer formed from the polymerizable monomers, selection of matrix resins (in relation to the glass transition temperature, cross-linking structure, compatibility with the polymer after the polymerizable monomers are polymerized, and the like, of the matrix resins), reactivity of the polymerizable monomers, molecular weight of the polymer after polymerization, mobility of the polymer in the matrix, and the like are considered to have influences. For example, even though the dark reaction is suppressed by adding a polymerization controlling agent, when the resultant polymer has an extremely small molecular weight and diffuses into the matrix after recording, the diffraction efficiency after recording may vary in some cases.

As described above, the additives for polymerization control may influence largely on the polymerization properties of the monomer and the molecular weight of the polymer. Therefore, in order to suppress the variation of the diffraction efficiency, not only the matrix resins and polymerizable monomers are selected adequately but also the additives for polymerization control are required to be selected properly.

The compound (A1) having a terpenoid structure, the compound (A2) represented by the aforementioned formula (I), and the cyclic or non-cyclic compound (A3) having at least two double bonds and two of these double bonds being present at 1 and 4 positions relatively, which are described in the present exemplary embodiments, are considered to satisfy these conditions.

Based on the above description, principal ways to control the variation of the diffraction efficiency are summarized below.
(1) In order to suppress the dark reaction, use an adequate amount of the specific chain transfer agent and the like represented by the aforementioned compound (A1), compound (A2), and compound (A3) (these compounds may be collectively referred to as component (A) hereinafter).
(2) Use a polymerizable monomer giving the polymer that does not diffuse into the matrix, as the photoactive compound (B).
(3) Select a system that has a glass transition temperature (Tg) in an adequate range, as the resin matrix (C).

Hereinafter, the exemplary embodiments of the present invention will be described in detail with the above (1) to (3) taken into account.

I. Composition for Volume Hologram Recording Layer Formation

In order to obtain a volume hologram optical recording medium with R1 of 4 or less, it is preferable that the recording layer contains at least one compound selected from the compound (A1) having a terpenoid structure, the compound (A2) represented by the aforementioned formula (I), and the cyclic or non-cyclic compound (A3) having at least two double bonds, two of these double bonds being present at 1 and 4 positions relatively.

Hereinafter, a description will be given of the compound (A1) having a terpenoid structure, the aforementioned compound (A2) represented by the formula (I), and the cyclic or non-cyclic compound (A3) having at least two double bonds, two of these double bonds being present at 1 and 4 positions relatively.

1. Compound (A1) Having Terpenoid Structure

The compound (A1) having a terpenoid structure used in the present exemplary embodiments maybe any compound that has a terpenoid structure.

Illustrative examples may include monoterpenes (for example, camphor, menthol, limonene, terpinerol, geraniol, nerol, citronellol, terpinolene, α,β,γ-terpinenes, and the like); sesquiterpenes (for example, farnesol, nerolidol, caryophyllene, and the like); diterpenes (for example, abietic acid, taxol, pimaric acid, geranyl geraniol, phytol, and the like); triterpenes (for example, squalene, and the like); and carotenoids. Among these, terpinolene, α-terpinene, β-terpinene, γ-terpinene, and the like are particularly preferable.

2. Compound (A2) Represented by Formula (I)

The compound represented by the formula (I) used for the composition for the volume hologram recording layer formation in the present exemplary embodiments is not particularly limited as long as it is a compound represented by the structure of the following formula (I).

[Chemical formula 4]

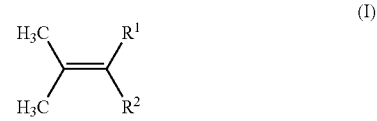

(In the formula (I), $R^1$ and $R^2$ each represent an organic group having 1 to 20 carbon atoms, and $R^1$ and $R^2$ may combine to form a ring structure.)

Illustrative examples may include 2,3,4-trimethyl-2-pentene, 2,3-dimethyl-2-butene, 6,6-dimethyl fulvene, isopropylidene malonic acid diethyl ester, and 5-methyl-2-(1-methylethylidene)-cyclohexanone. Among these, 6,6-dimethyl fulvene is preferable.

3. Cycylic or Non-Cyclic Compound (A3) Having at Least Two Double Bonds, Two of the Double Bonds Being Present at 1 and 4 Positions Relatively The cycylic or non-cyclic compound (A3) having at least two double bonds, two of the double bonds being present at 1 and 4 positions relatively, which is preferably used in the present exemplary embodiments, may include specifically the following compounds.

Examples of a compound having a cyclic structure may include 1,4-cyclohexadiene, 1-methyl-1,4-cyclohexadiene, 1,2-dimethyl-1,4-cyclohexadiene, 1-ethyl-1,4-cyclohexadiene, 1-propyl-1,4-cyclohexadiene, 1-phenyl-1,4-cyclohexadiene, 1-methoxy-1,4-cyclohexadiene, 1-aceto-1,4-cyclohexadiene, 1-chloro-1,4-cyclohexadiene, 1-bromo-1,4-cyclohexadiene, 4,7-dihydroindane, 1,2,3,4,5,8-hexahydronaphthalene, 1,4-cycloheptadiene, and 1,4-cyclooctadiene.

Examples of the non-cyclic compound may include 1,4-heptadiene; 1,4-hexadiene; 2-methyl-1,4-pentadiene; 3,6-nonanediene-1-ol; 9,12-octadecadienol; linolenic acid; γ-linolenic acid; and the derivatives of linolenic acid such as methyl linolenate, ethyl linolenate, isopropyl linolenate, or linolenic anhydride; linoleic acid and the derivatives thereof such as methyl linoleate, ethyl linoleate, isopropyl linoleate, or linoleic anhydride; eicosapentaenoic acid and the derivatives thereof such as ethyl eicosapentaenoate; and docosahexaenoic acid and the derivatives thereof such as ethyl docosahexaenoate.

The photo reaction proceeding in the light portions upon hologram recording may be controlled by using at least one compound selected from the compound (A1) having a terpenoid structure, the compound (A2) represented by the aforementioned formula (I), and the cyclic or non-cyclic compound (A3) having at least two double bonds, two of these double bonds being present at 1 and 4 positions relatively. In addition, a polymerization reaction proceeding in portions other than the light portions may be suppressed, and the polymerization reaction that usually continues for a given period of time after light irradiation can be also suppressed. Further, the recording sensitivity becomes controllable.

Therefore, polymerization reactions proceeds only in the light portions and the reactions in the dark portions are suppressed, so that the S/N ratio of recorded signals maybe improved largely.

In addition, the polymerization reaction after light irradiation (dark reaction) is also suppressed, so that the variation of the intensity of recorded signals is also reduced. Because of this, the temporal change of recorded signals is prevented and reliability is improved. Further, reactions are suppressed in portions other than the recorded portions, so that the photoactive compound is used efficiently. As a result, the dynamic range of recording is considered to expand.

As the composition for the volume hologram recording layer formation that is used for the volume hologram optical recording medium of the present exemplary embodiments, conventional compositions for the volume hologram recording layer formation that are composed of a resin matrix, a photoactive compound, a photopolymerization initiator, and the like may be used. Particularly, in an optical image forming system containing a photoactive polymerizable compound (B), it is preferable to add at least one compound selected from the compound (A1) having a terpenoid structure, the compound (A2) represented by the aforementioned formula (I), and the cyclic or non-cyclic compound (A3) having at least two double bonds, two of these double bonds being present at 1 and 4 positions relatively.

4. Photoactive Polymerizable Compound (B)

The photoactive polymerizable compound (B) that is used for the composition for the volume hologram recording layer formation of the present exemplary embodiments is not particularly limited on the kind thereof, and maybe selected from known compounds as needed. However, the diffraction efficiency may vary after recording in some cases when the formed polymer has an extremely small molecular weight and diffuses into the matrix after recording, so that the monomer which gives polymer having a molecular weight of 500 or more is usually used as a polymerizable monomer. The molecular weight of the polymerizable monomer may be evaluated by extraction of the recording layer from the optical recording medium after recording by a solvent, followed by a molecular weight measurement of the extracted polymerizable monomer with conventional methods such as GPC. Examples of the polymerizable monomers may include the following cation polymerizable monomers, anion polymerizable monomers, and radical polymerizable monomers.

4-1) Cation Polymerizable Monomers

Examples of the cation polymerizable monomers may include a compound having an oxirane ring, styrene and the derivatives thereof, vinylnaphthalene and the derivatives thereof, vinyl ethers, N-vinyl compounds, and compounds having an oxetane ring.

Among these, a compound at least having an oxetane ring is preferably used. Further, it is preferable that the compound having an oxetane ring is used in combination with the compound having an oxirane ring.

Examples of the compound having an oxirane ring may include a prepolymer that contains two or more oxirane rings per molecule.

Examples of the prepolymer may include alicyclic polyepoxides, polyglycidyl esters of polybasic acids, polyglycidyl ethers of polyhydric alcohols, polyglycidyl ethers of polyoxyalkylene glycols, polyglycidyl ethers of aromatic polyols, hydrogenated polyglycidyl ethers of aromatic polyols, urethane polyepoxy compounds, and epoxidized polybutadienes.

These prepolymers may be used solely or in any combination and ratio of two or more kinds.

Examples of the styrene and the derivatives thereof may include styrene, p-methylstyrene, p-methoxystyrene, β-methylstyrene, p-methyl-β-methylstyrene, α-methylstyrene, p-methoxy-β-methylstyrene, and divinylbenzene.

Examples of the vinylnaphthalene and the derivatives thereof may include 1-vinylnaphthalene, α-methyl-1-vinylnaphthalene, β-methyl-1-vinylnaphthalene, 4-methyl-1-vinylnaphthalene, and 4-methoxy-1-vinylnaphthalene.

Examples of the vinyl ethers may include isobutyl ether, ethylvinyl ether, phenylvinyl ether, p-methylphenylvinyl ether, and p-methoxyphenylvinyl ether.

Examples of the N-vinyl compound may include N-vinylcarbazole, N-vinylpyrrolidone, N-vinylindole, N-vinylpyrrole, and N-vinylphenothiazine.

Examples of the compound having an oxetane ring may include various known oxetane compounds as described in Japanese Patent Application Laid Open Publications No. 2001-220526 and No. 2001-310937 and others.

The above exemplified cation polymerizable monomers may be used solely or in any combination and ratio of two or more kinds.

4-2) Anion Polymerizable Monomers

Examples of the anion polymerizable monomers may include hydrocarbon monomers and polar monomers.

Examples of the hydrocarbon monomers may include styrene, α-methyl styrene, butadiene, isoprene, vinylpyridine, vinylanthracene, and the derivatives thereof.

Examples of the polar monomers may include methacrylic acid esters (for example, methylmethacrylate, ethylmethacrylate, or isopropylmethacrylate); acrylic acid esters (for example, methylacrylate or ethylacrylate); vinyl ketones (for example, methylvinyl ketone, isopropylvinyl ketone, cyclohexylvinyl ketone, or phenylvinyl ketone); isopropenyl ketones (for example, methylisopropenyl ketone or phenylisopropenyl ketone); and other polar monomers (for example, acrylonitrile, acrylamide, nitroethylene, methylenemaloate, cyanoacrylate, or vinylidene cyanide).

The above exemplified anion polymerizable monomers may be used solely or in any combination and ratio of two or more kinds.

4-3) Radical Polymerizable Monomers

The radical polymerizable monomers are a compound having one or more ethylenic unsaturated double bond per molecule, and may include, for example, (meth)acrylates, (meth)acrylamides, vinyl esters, and styrenes.

Examples of the (meth)acrylates may include methyl (meth)acrylate, ethyl(meth)acrylate, (n- or i-)propyl(meth)acrylate, (n-, i-, sec-, or t-)butyl(meth)acrylate, amyl(meth)

acrylate, adamantyl(meth)acrylate, chloroethyl(meth)acrylate, 2-hydroxyethyl(meth)acrylate, 2-hydroxypropyl(meth)acrylate, 2-hydroxypentyl(meth)acrylate, cyclohexyl(meth)acrylate, allyl(meth)acrylate, trimethylolpropane mono(meth)acrylate, pentaerythritolmono(meth)acrylate, benzyl(meth)acrylate, methoxybenzyl(meth)acrylate, chlorobenzyl(meth)acrylate, hydroxybenzyl(meth)acrylate, hydroxyphenetyl(meth)acrylate, dihydroxyphenetyl(meth)acrylate, furfuryl(meth)acrylate, tetrahydrofurfuryl(meth)acrylate, phenyl(meth)acrylate, hydroxyphenyl(meth)acrylate, chlorophenyl(meth)acrylate, sulfamoylphenyl(meth)acrylate, 2-phenoxyethyl(meth)acrylate, 2-(hydroxyphenylcarbonyloxy)ethyl(meth)acrylate, phenol EO modified (meth)acrylate, paracumylphenol EO modified (meth)acrylate, nonylphenol EO modified (meth)acrylate, N-acryloyloxyethyl hexahydrophthalimide, bisphenol F EO modified diacrylate, bisphenol A EO modified diacrylate, dibromophenyl(meth)acrylate, tribromophenyl(meth)acrylate, dicyclopentenyloxyethyl(meth)acrylate, dicyclopentanyl acrylate, tricyclodecanedimethylol di(meth)acrylate, and bisphenoxyethanolfluorene di(meth)acrylate.

Examples of the (meth)acrylamides may include (meth)acrylamide, N-methyl(meth)acrylamide, N-ethyl(meth)acrylamide, N-propyl(meth)acrylamide, N-butyl(meth)acrylamide, N-benzyl(meth)acrylamide, N-hydoxyethyl(meth)acrylamide, N-phenyl(meth)acrylamide, N-tolyl(meth)acrylamide, N-(hydroxyphenyl)(meth)acrylamide, N-(sulfamoylphenyl)(meth)acrylamide, N-(phenylsulfonyl)(meth)acrylamide, N-(tolylsulfonyl)(meth)acrylamide, N,N-dimethyl(meth)acrylamide, N-methyl-N-phenyl(meth)acrylamide, and N-hydroxyethyl-N-methyl(meth)acrylamide.

Examples of the vinyl esters may include vinyl acetate, vinyl butylate, vinyl benzoate, vinyl benzoate, vinyl t-butylbenzoate, vinyl chlorobenzoate, vinyl 4-ethoxybenzoate, vinyl 4-ethylbenzoate, vinyl 4-methylbenzoate, vinyl 3-methylbenzoate, vinyl 2-methylbenzoate, vinyl 4-phenylbenzoate, and vinyl pivalate.

Examples of the styrenes may include styrene, p-acetylstyrene, p-benzoyl styrene, 2-butoxymethylstyrene, 4-butylstyrene, 4-sec-butylstyrene, 4-tert-butylstyrene, 2-chlorostyrene, 3-chlorostyrene, 4-chlorostyrene, dichlorostyrene, 2,4-diisopropylstyrene, dimethylstyrene, p-ethoxystyrene, 2-ethylstyrene, 2-methoxystyrene, 4-methoxystyrene, 2-methylstyrene, 3-methylstyrene, 4-methylstyrene, p-methylstyrene, p-phenoxystyrene, and p-phenylstyrene.

The above exemplified radical polymerizable monomers may be used solely or in any combination and ratio of two or more kinds.

Any of the above exemplified cation polymerizable monomers, anion polymerizable monomers, and radical polymerizable monomers maybe used, and two or more kinds may be used in combination. However, for the reason that the reaction for forming a resin matrix is not likely to be inhibited, it is preferable that the radical polymerizable monomers are used as the photoactive compound.

The composition for the volume hologram recording layer formation of the present exemplary embodiments may preferably further include a resin matrix (C) and a photopolymerization initiator (D).

5. Resin Matrix (C)

As the resin matrix (C) of the present exemplary embodiments, a resin dissolvable in a solvent or a three-dimensionally crosslinked resin may be used.

Examples of the resin dissolvable in a solvent may include chlorinated polyethylene, polymethyl methacrylate, a copolymer of methyl methacrylate and other alkyl acrylate, a copolymer of vinyl chloride and acrylonitrile, polyvinyl acetate, polyvinyl alcohol, polyvinyl formal, polyvinyl butyral, polyvinyl pyrrolidone, ethyl cellulose, and acetyl cellulose. Among these, polymethyl methacrylate is preferable.

The three dimensional resin matrix is insoluble in a solvent and includes a cured reaction product of a polymerizable compound that is in a liquid state at ordinary temperature and a compound that is reactive to the polymerizable compound. Since the three-dimensionally crosslinked resin matrix works as a physical obstruction, it suppresses the volume change upon recording. That is, in the recording layer after recording, the light portions expand and the dark portions shrink, so that the surface of the volume hologram optical recording medium becomes uneven. In order to suppress this volume change, it is more preferable that the three-dimensionally crosslinked resin matrix is used in the recording layer.

The properties of the resin matrix influence the mobility of polymerizable monomers, the difficulty of diffusion of a polymer obtained from the polymerizable monomers, or the like, so that a resin matrix having adequate properties is required to be selected. For example, from the viewpoint of the mobility of polymerizable monomers, it is preferable that the glass transition temperature of the resin matrix is low, but from the viewpoint of suppressing the diffusion of the polymer after polymerization or from the viewpoint of the durability of the recording medium, it is preferable that the glass transition temperature is high.

Considering these points totally, it is preferred that the glass transition temperature Tg of the resin matrix is in the range of usually −45° C. or higher and preferably −40° C. or higher and usually 200° C. or lower. When the glass transition temperature Tg is too low, signal stability (diffraction efficiency stability) after recording becomes insufficient. When too high, recording often becomes difficult or impossible.

The glass transition temperature Tg of the resin matrix is substantially equal to the glass transition temperature Tg of the hologram recording layer and may be evaluated by taking out only the recording layer from the hologram record medium, cutting out the recording layer into a specimen with an appropriate size, then measuring the specimen using known methods such as a dynamic viscoelasticity measuring apparatus or the like.

Note that, the glass transition temperature Tg of the resin matrix may be controlled by regulating mainly the following three factors:
1) the structure of polyol, polyisocyanate, epoxy or the like that composes the resin matrix;
2) the cross-linking density of the resin matrix; and
3) the molecular weight of polyol, polyisocyanate, epoxy or the like that composes the resin matrix.

Generally, when the cross-linking density of the resin matrix increases, the glass transition temperature Tg of the resin matrix increases. That is, by regulating the content of polyol, polyisocyanate or the like that has three or more functional groups and contributes to cross-linking, the glass transition temperature Tg of the resin matrix may be controlled. The content of the polyol, polyisocyanate or the like that has three or more functional groups is usually 0.1 wt % or more with respect to the total weight of the matrix and is appropriately selected in the range of up to 100 wt % considering the structure of the resin matrix, the molecular weight of the resin matrix source material, and the like.

Generally, as the molecular weight of the source material is larger, the glass transition temperature Tg of the resin matrix lowers. Therefore, by regulating the molecular weight of the source material within a predetermined range, the glass transition temperature Tg of the resin matrix may be controlled.

The examples of the reactions usable for the formation of the three dimensionally cross-linked resin matrix include, but are not limited to, cation epoxy polymerization, cation vinyl ether polymerization, cation alkenyl ether polymerization, cation allene ether polymerization, cation ketene acetal polymerization, addition polymerization of epoxy group and amine group, addition polymerization of epoxy group and thiol group, addition polymerization of unsaturated ester group and amine group (through Michael addition), addition polymerization of unsaturated ester group and thiol group (through Michael addition), addition polymerization of vinyl group and silicon hydride (hydrosilylation), addition polymerization of isocyanate group and hydroxyl group (urethane formation), addition polymerization of isocyanate group and thiol group, and addition polymerization of cyanate group and amine group (urea formation).

The foregoing reactions are enabled or promoted by adequate catalysts.

For example, the cation epoxy polymerization proceeds rapidly at room temperature with a catalyst containing BF3 as a main component; other cation polymerization proceeds in the presence of proton; the reaction of epoxy group and mercaptan group and the Michael additions are promoted by bases such as amines; the hydrosilylation proceeds rapidly in the presence of a transition metal catalyst such as platinum; and the formation of urethane and urea proceeds rapidly when a tin catalyst is used.

Among these, the addition reaction of isocyanate group and hydroxyl group, the addition reaction of isocyanate group and amine group, the addition reaction of isocyanate group and thiol group, the addition reaction of epoxy group and amine group, and the addition reaction of epoxy group and thiol group are preferable because the crosslinking reaction is possible at adequate temperature and within adequate time. Hereinafter, the source materials usable for these reactions will be described.

5-1) Polyisocyanate

The polyisocyanate that is usable for the reaction of isocyanate group and hydroxyl group, the reaction of isocyanate group and amine group, and the reaction of isocyanate group and thiol group is not particularly limited on the kind thereof as long as it has two or more isocyanate groups per molecule. The number of isocyanate groups per molecule is not particularly limited as long as it is two or more usually, but when the number of isocyanate groups is overly small, the matrix does not acquire required hardness in some cases. On the other hand, the upper limit of the number of isocyanate groups is not particularly limited, but it is usually preferably 5 or less. When isocyanate groups excessively remain in a large amount in the matrix, possibly the storage stability of the matrix is degraded.

Examples of the polyisocyanate used in the present exemplary embodiments may include an aliphatic isocyanate (for example, hexamethylene diisocyanate, lysine methylester diisocyanate, or 2,4,4-trimethyl hexamethylene diisocyanate); an alicyclic isocyanate (for example, isophorone diisocyanate, 4,4'-methylene bis(cyclohexyl isocyanate, or 1,3-bis (isocyanatomethyl)cyclohexane); an aromatic isocyanate (for example, tolylene-2,4-diisocyanate, tolylene-2,5-diisocyanate, tolylene-2,6-diisocyanate, 4,4'-diphenylmethane diisocyanate, xylylene diisocyanate, or naphthalene-1,5'-diisocyanate); and the multimers thereof. As the multimers, the trimers to heptamers thereof are preferable.

In addition, the examples of the polyisocyanate may also include the reaction products of isocyanate with water or polyhydric alcohols such as trimethylol ethane or trimethylol propane. Among these, tolylene diisocyanate, hexamethylene diisocyanate, the multimers thereof, or the derivatives thereof are particularly preferable.

Further, a polyfunctional polyisocyanate (prepolymer) having terminal isocyanate groups obtained by reacting the above isocyanates and a compound having two or more active hydrogen groups maybe also used. As the compound having two or more active hydrogen groups, ethylene glycol, propylene glycol, 1,4-butane diol, 1,4-cyclohexane dimethanol, polyethylene glycol, polytetramethylene glycol, ethylenediamine, isophorone diamine, 4,4'-diaminodicyclohexyl methane, polyols described later, or the like may be used.

The number average molecular weight of the compound having isocyanate groups is preferably 100 or more and 50,000 or less, more preferably 150 or more and 10,000 or less, and still more preferably 150 or more and 5,000 or less. When the number average molecular weight is too smaller than 100, the cross-linking density increases, so that the hardness of the matrix becomes too high. Whereby, possibly the recording speed lowers. When the number average molecular weight is too larger than 10,000, the compatibility with other components lowers or the cross-linking density lowers, so that the hardness of the matrix becomes too low. Whereby, the recorded content disappears in some cases.

Note that, the compound having isocyanate groups may contain an additional constitutional element other than isocyanate groups as long as the effect of the present exemplary embodiments is not markedly impaired.

5-2) Polyol

The polyol usable in the reaction of isocyanate group and hydroxyl group is not particularly limited on the kind thereof as long as it has two or more hydroxyl groups per molecule. The number of hydroxyl groups per molecule is not particularly limited as long as it is usually two or more, but when the number of hydroxyl groups is too small, the matrix does not acquire required hardness in some cases. On the other hand, the upper limit of the number of hydroxyl groups is not particularly limited, but usually preferably 5 or less. When hydroxyl groups remain in an overly large amount in the matrix, the moisture absorption of the matrix becomes high, and thereby the storage stability of recording is affected in some cases.

Examples of the polyol may include ethylene glycol, propylene glycol, 1,4-butane diol, 1,5-pentane diol, 3-methyl-1,5-pentane diol, 1,6-hexane diol, neopentyl glycol, diethylene glycol, 1,4-cyclohexane diol, 1,4-cyclohexane dimethanol, decamethylene glycol, polyethylene glycol, polytetramethylene glycol, polyester polyol, polycaprolactone polyol, polycarbonate polyol, and polyether polyol.

The number average molecular weight of the polyol is preferably 100 or more and 50,000 or less, more preferably 150 or more and 10,000 or less, and still more preferably 150 or more and 5,000 or less. When the number average molecular weight is too smaller than 100, the cross-linking density increases, so that the hardness of the matrix becomes too high. Whereby, possibly the recording speed lowers. When the number average molecular weight is too larger than 50,000, the compatibility with other components lowers or the cross-linking density lowers, so that the hardness of the matrix becomes too low. Whereby, the recorded content disappears in some cases.

5-3) Epoxy Compound

The epoxy compound usable for the reaction of epoxy group and amine group and the reaction of epoxy group and thiol group is not particularly limited on the kind thereof as long as it has two or more epoxy groups per molecule. The number of epoxy groups per molecule is not particularly limited as long as it is usually two or more, but when the number of epoxy groups is too small, the matrix does not acquire required hardness in some cases. On the other hand, the upper limit of epoxy groups is not particularly limited, but usually preferably 5 or less. When epoxy groups remain in an overly large amount in the matrix, the storage stability of recording is affected in some cases.

Examples of the compound having two or more epoxy groups per molecule may include a polyglycidyl ether compound of a polyol (for example, (poly)ethylene glycol, (poly)propylene glycol, (poly)tetramethylene glycol, trimethylol propane, or glycerin); an alicyclic epoxy compound having a 4 to 7 membered cyclic aliphatic group (for example, 3,4-epoxycyclohexylmethy-3,4-epoxycyclohexane carboxylate or 3,4-epoxy-1-methylcyclohexy-3,4-epoxy-1-methylhexane carboxylate); a bisphenol A-type epoxy compound; a hydrogenated bisphenol A-type epoxy compound; a bisphenol F-type epoxy compound; and a phenol or cresol novolac-type epoxy compound.

The number average molecular weight of the compound having epoxy groups is preferably 100 or more and 50,000 or less, more preferably 150 or more and 10,000 or less, and still more preferably 150 or more and 5,000 or less. When the number average molecular weight is too smaller than 100, the cross-linking density increases, so that the hardness of the matrix becomes too high. Whereby, possibly the recording speed lowers. When the number average molecular weight is too larger than 50,000, the compatibility with other components lowers or the cross-linking density lowers, so that the hardness of the matrix becomes too low. Whereby, the recorded content disappears in some cases.

5-4) Amine

Examples of the compounds usable for the additional reaction of isocyanate group and amine group and the additional reaction of epoxy group and amine group are not particularly limited on the kind thereof as long as they have two or more amino groups per molecule.

Examples of the compounds having two or more amino groups per molecule include aliphatic amines (for example, ethylenediamine, diethylene triamine, triethylene tetramine, hexamethylene diamine, or the like); alicyclic amines (for example, isophorone diamine, menthane diamine, 4,4'-diaminodicyclohexyl methane, or the like); and aromatic amines (for example, m-xylylene diamine, diaminodiphenyl methane, m-phenylene diamine, or the like).

The number average molecular weight of the compound having amino groups is preferably 100 or more and 50,000 or less, more preferably 150 or more and 10,000 or less, and still more preferably 150 or more and 5,000 or less. When the number average molecular weight is too smaller than 100, the cross-linking density increases, so that the hardness of the matrix becomes too high. Whereby, possibly the recording speed lowers. When the number average molecular weight is too larger than 50,000, the compatibility with other components lowers or the cross-linking density lowers, so that the hardness of the matrix becomes too low. Whereby, the recorded content disappears in some cases.

5-5) Thiol

Examples of the compounds usable for the addition reaction of isocyanate group and thiol group and the addition reaction of epoxy group and thiol group are not particularly limited on the kind thereof as long as they have two or more thiol groups per molecule.

Examples of the compound having two or more thiol groups per molecule may include 1,3-butane dithiol, 1,4-butane dithiol, 2,3-butane dithiol, 1,2-benzene dithiol, 1,3-benzene dithiol, 1,4-benzene dithiol, 1,10-decane dithiol, 1,2-ethane dithiol, 1,6-hexane dithiol, and 1,9-nonane dithiol.

6. Photopolymerization Initiator (D)

As the photopolymerization initiator (D), any known photopolymerization initiators may be used. For example, the photopolymerization initiators include, for example, azo compounds, azide compounds, organic peroxides, organic borates, onium salts, bisimidazole derivatives, titanocene compounds, iodonium salts, organic thiol compounds, alkylphenone compounds, organic phosphorus compounds such as acylphosphine oxide compounds, oxime ester compounds, and halogenated hydrocarbon derivatives. These may be used solely or in any combination and ratio of two or more kinds. Among these, as the photopolymerization initiator, from the viewpoint of having a capability of initiating polymerization in a visible light region, titanocene compounds, acylphosphine oxide compounds, oxime ester compounds, or the like are preferable.

6-1)

When the titanocene compounds are used as the polymerization initiator, the kind thereof is not particularly limited, but the various titanocene compounds described in Japanese Patent Application Laid Open Publications No. 59-152396 and No. 61-151197 may be selected and used appropriately, for example.

Illustrative examples of the titanocene compounds may include di-cyclopentadienyl-Ti-di-chloride, di-cyclopentadienyl-Ti-bis-phenyl, di-cyclopentadienyl-Ti-bis-2,3,4,5,6-pentafluorophen-1-yl, di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-bis-2,6-difluorophen-1-yl, di-cylopentadienyl-Ti-bis-2,4-difluorophen-1-yl, di-methylcyclopentadienyl-Ti-bis-2,3,4,5,6-pentafluorophen-1-yl, di-methylcyclopentadienyl-Ti-bis-2,3,5,6-tetrafluorophen-1-yl, di-methylcyclopentadienyl-Ti-bis-2,6-difluorophen-1-yl, and di-cyclopentadienyl-Ti-bis-2,6-difluoro-3-(1H-pyrrol-1-yl)-phen-1-yl.

Particularly, di-cyclopentadienyl-Ti-bis-2,6-difluoro-3-(1 H-pyrrol-1-yl)-phen-1-yl is suitably used as the polymerization initiator, because it has absorption up to around 550 nm, allows argon ion laser (488 nm) or FD-Nd/YAG laser (532 nm) to be used as a light source, and thus it has a high versatility.

6-2)

Illustrative examples of the acylphosphine oxide compounds may include a mono-functional initiator that has only one photo-cleavable point per molecule, such as triphenylphosphine oxide, 2,4,6-trimethylbenzoyl diphenylphosphine oxide, or 2,6-dichlorobenzoyl diphenylphosphine oxide, and a bi-functional initiator that has two photo-cleavable points per molecule, such as bis(2,4,6-trimethylbenzoyl)-phenylphosphine oxide, bis(2,6-dimethoxybenzoyl)-2,4,4-trimethylpentylphosphine oxide, bis(2,6-dichlorobenzoyl)-4-propylphenylphosphine oxide, or bis(2,6-dichlorobenzoyl)-2,5-dimethylphenylphosphine oxide.

6-3)

Illustrative examples of the oxime ester compounds may include the ones having the following structure.

[Chemical formula 5]

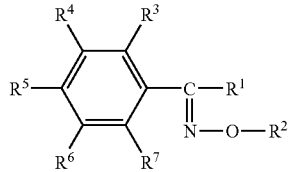

In the above formula, $R^1$ to $R^7$ represent any substitution groups.

Specifically, the examples thereof include 1,2-octanedione, 1-[4-(phenylthio)-2-(O-benzoyloxime)] and ethanone, and 1-[9-ethyl-6-(2-methylbenzoyl)-9H-carbazol-3-yl-1-(O-acetyloxime).

The foregoing various photopolymerization initiators may be used solely or in any combination and ratio of two or more kinds.

The amount of the photopolymerization initiator to be used is in the range of usually 0.01 wt % or more, preferably 0.05 wt % or more, more preferably 0.1 wt % or more, and particularly preferably 0.5 wt % or more and usually 10 wt % or less and particularly preferably 5 wt % or less with respect to the total components ((A)+(B)+(C)+(D)+(others)) of the composition for the volume hologram recording layer formation. Here, the component (A) includes the aforementioned compound (A1), compound (A2), and compound (A3).

When the used amount of the photopolymerization initiator is too small, the rate of photopolymerization becomes slow and the hologram recording sensitivity lowers in some cases, because the amount of radicals generated becomes small. On the other hand, when the used amount of the photopolymerization initiator is too large, the contribution of the radicals generated by light irradiation to photopolymerization becomes small and the hologram recording sensitivity also lowers in some cases, because the radicals recombine with each other or disproportionate.

Further, when the amount of the photopolymerization initiator is too large, the amount of radicals generated at one time becomes unnecessarily too much, thereby leading remarkable lowering in the molecular weight of polymers formed in some cases. In such occasions, the aforementioned diffusion of polymers in the resin matrix is likely to occur, thereby possibly causing the variation of the diffraction efficiency. When two or more kinds of polymerization initiators are used in combination, the total amount thereof is selected to fall in the above range.

7. Ratio of Compound

The ratio of the photoactive compound (B) with respect to 100 parts by weight of a resin matrix (C) is preferably 0.5 part by weight or more and 100 parts by weight or less, and particularly 1 part by weight or more and 50 parts by weight or less.

When the used amount of the photoactive compound is excessively small, the change in refractive index is small, thereby lowering the recording efficiency in some cases. On the other hand, when the used amount of the photoactive compound is excessively large, unreacted photoactive compound remains in a large amount, thereby causing bleed out when incorporated into a recording material in some cases.

At least one compound, which serves as the component (A), selected from the compound (A1) having a terpenoid structure, the compound (A2) represented by the aforementioned formula (I), and the cyclic or non-cyclic compound (A3) having at least two double bonds and two of these double bonds being present at 1 and 4 positions relatively, is used in a manner that the sum of ((A1)+(A2)+(A3)) is in the range of 10 ppm to 5% and preferably 100 ppm to 1% with respect to the total components ((A)+(B)+(C)+(D)+(others)) of the composition for the volume hologram recording layer formation. When the sum of ((A1)+(A2)+(A3)) is too large, the diffraction efficiency and sensitivity are likely to lower. In contrast, when the sum of ((A1)+(A2)+(A3)) is too small, desired effects are not attained.

8. Other Components

The composition for the volume hologram recording layer formation according to the present exemplary embodiments may include other components besides the aforementioned components within the scope of the present exemplary embodiments.

For example, the composition for the volume hologram recording layer formation according to the present exemplary embodiments may be admixed with any additives in accordance with necessities such as controlling of the excitation wavelength or excitation energy of a sensitizer, controlling of reactions, or improvement of properties.

Examples of the additives may include the following compounds.

For example, a compound that controls the excitation of the sensitizer may be added. The examples in this case may include a sensitizer and an auxiliary sensitizer.

Any sensitizer may be selected and used from various known sensitizer. Although depending on the wavelength of laser light used for recording and the kind of initiators used, in a system using a green laser, preferred examples of the sensitizer may include the compounds described in Japanese Patent Application Laid Open Publications No. 5-241338 and No. 2-69, Japanese Patent Application Publication No. 2-55446, and the like; and in a system using a blue laser, the examples may include the compounds described in Japanese Patent Application Laid Open Publications No. 2000-10277 and No. 2004-198446. The above exemplified various sensitizer may be used solely or in any combination and ratio of two or more kinds.

Further, a compound used to control reactions may be added. Examples in this case may include a polymerization initiator, a chain transfer agent, a polymerization terminator, a compatibilizer, and an auxiliary agent for reaction.

Besides above, examples of the additives required for the improvement of properties may include a dispersant, a defoaming agent, a plasticizer, a preservative agent, a stabilizer, and an antioxidant.

These additives may be used solely or in any combination and ratio of two or more kinds.

The amount of the additives to be used is, with respect to the total components ((A)+(B)+(C)+(D)+(others)) of the composition for the volume hologram recording layer formation according to the present exemplary embodiments, in the range of usually 0.001 wt % or more, particularly 0.01 wt % or more, and usually 30 wt % or less, particularly 10 wt % or less. When two or more additives are used in combination, the total amount thereof is selected to fall in the above range.

II. Volume Hologram Recording Material

A volume hologram recording material using the composition for the volume hologram recording layer formation according to one exemplary embodiment of the present invention is hereinafter called as "volume hologram recording material of the present exemplary embodiment."

The volume hologram recording material of the present exemplary embodiment may be composed of only the composition for the volume hologram recording layer formation according to the present exemplary embodiment or may contain additional components. The composition for the volume hologram recording layer formation according to the present exemplary embodiment may be used solely or in any combination and ratio of two or more kinds. The additional components are not particularly limited, but examples thereof may include various additives such as a light dispersing agent or a color material. The content of the additional components is also optionally determined as long as the effect of the present exemplary embodiments is not markedly impaired.

III. Volume Hologram Optical Recording Medium

The volume hologram optical recording medium of the present exemplary embodiments is composed at least of a recording layer containing a synthetic resin. Other configurations of the volume hologram optical recording medium of the present exemplary embodiments are not specifically limited and are arbitrarily selected. Hereinafter, a volume hologram optical recording medium according to one exemplary embodiment of the present invention (this is also referred to as an "optical recording medium according to the present exemplary embodiment" in some cases) will be described in detail.

The optical recording medium of the present exemplary embodiment includes a recording layer that is formed by using the above-described volume hologram recording material of the present exemplary embodiments. Further, the optical recording medium according to the present exemplary embodiment includes a support and optionally additional layers, as necessary.

The recording layer is the layer in which information is recorded. The thickness of the recording layer is not particularly limited and is selected appropriately considering recording method or the like, but is generally in the range of usually 1 μm or more, preferably 10 μm or more, and usually 1 cm or less, preferably 2,000 μm or less. When the recording layer is excessively thick, the selectivity of each hologram becomes low upon multiple recording in the optical recording medium, thereby lowering the degree of the multiple recording in some cases. When the recording layer is excessively thin, it is difficult to mold uniformly the whole recording layer, whereby multiple recording with a uniform diffraction efficiency of each hologram and a high S/N ratio possibly becomes difficult in some cases.

Usually, the optical recording medium has a support, and the recording layer and additional layers are laminated on the support to form the optical recording medium. However, when the recording layer or additional layers have sufficient strength and durability, the optical recording medium may have no support.

The support is not particularly limited on the details thereof as long as it has required strength and durability, and any support is usable.

The support has no specific limitation on the shape thereof, but usually is formed into a flat plate or a film.

The material of the support is not particularly limited, and is acceptable whether it is transparent or not.

Examples of the material for the transparent support may include an organic material such as acryl, polyester, polyethylene terephthalate, polyethylene naphthoate, polycarbonate, polyethylene, polypropylene, amorphous polyolefin, polystyrene, or cellulose acetate; and an inorganic material such as glass, silicon, or quartz. Among these, polycarbonate, acryl, polyester, amorphous polyolefin, glass, and the like are preferable, and particularly polycarbonate, acryl, amorphous polyolefin and glass are more preferable.

On the other hand, examples of the material for the opaque support may include metal such as aluminum, the above described transparent support coated with metal such as gold, silver or aluminum or a dielectric material such as magnesium fluoride or zirconium oxide.

The thickness of the support is also not particularly limited, but usually in the range of preferably 0.1 mm or more and 3 mm or less. When the support is too thin, the substrate may warp because the mechanical strength of the optical recording medium becomes insufficient in some cases. When too thick, possibly the amount of light transmission decreases and the cost becomes additionally high in some cases.

The surface of the support maybe subjected to surface treatment. Usually, the surface treatment is performed to increase the adhesion between the support and the recording layer. Examples of the surface treatment may include corona discharge treatment to the support and preliminary forming of an underlying coating layer on the support. The composition used for the underlying coating layer may include halogenated phenol, a partially hydrolyzed copolymer of vinyl chloride and vinyl acetate, and a polyurethane resin.

The surface treatment may be performed for another purpose other than increasing adhesion.

Examples of the surface treatment for another purpose may include a reflective coating treatment in which a reflective coating layer made of metal such as gold, silver or aluminum is formed; and a dielectric coating treatment in which a dielectric layer made of magnesium fluoride or zirconium oxide is formed. These layers may be formed in a single layer or in two or more layers.

The support may be formed on either side of upper or lower or both sides of the recording layer of the optical recording medium of the present exemplary embodiments. Note that, when the support is formed on both of upper and lower sides of the recording layer, at least one of the supports is made to be transparent so as to transmit active energy rays (including excitation light, reference light, and reproduction light).

In the case of an optical recording medium that has the transparent substrate on one side or both sides of the recording layer, recording of a transmission or reflection hologram is attainable. In the case of using a support having a reflective property on one side, recording of a reflection hologram is attainable.

Further, a patterning for data addressing may be formed on the support. There is not any limitation on the method of patterning, but in one method, an uneven pattering may be formed on the support itself; in another method, the patterning may be formed on a reflection layer (described later); or the patterning may be formed by a combination of the former two methods, for example.

The optical recording medium according to the present exemplary embodiments may include additional layers besides the recording layer and support described above. Examples of the additional layers may include a protection layer, a reflection layer and an anti-reflection layer (anti-reflection film).

The protection layer serves to prevent adverse effects such as lowering in sensitivity or degradation of storage stability, caused by oxygen or water. There is not any limitation on the specific configuration of the protection layer, but known ones are applicable optionally. A layer composed of a water-soluble polymer, at least any one of organic and inorganic materials, or the like may be formed as the protection layer, for example.

The reflection layer is formed when the optical recording medium is configured in a reflection type. In the case of a reflection type optical recording medium, the reflection layer may be formed between the support and the recording layer or on the outside face of the transparent substrate, but usually preferably between the support and the recording layer.

Further, in both of the transparent and reflection type optical recording media, the anti-reflection layer may be provided on the incoming and outgoing sides of the recording light and read-out light or between the recording layer and the support. The anti-reflection layer serves to enhance the utilization efficiency of light and to prevent occurrence of ghost images.

There is not any particular limitation on the method of producing the optical recording medium according to the present exemplary embodiment, and the medium may be produced by any methods. For example, the recording layer is formed by coating the support with the volume hologram recording material according to the present exemplary embodiments without solvent so as to produce the medium.

On this occasion, any method may be applied as the coating method. Illustrative examples of the method may include spray coating, spin coating, wire bar coating, dip coating, air knife coating, roll coating, blade coating, and doctor roll coating.

When a thick recording layer is formed in particular, a method in which the volume hologram recording material according to the present exemplary embodiments is put in a mold to be shaped or a method in which a separation film is coated with the volume hologram recording material and then the film is punched out to obtain the recording layer may be also used.

Alternatively, the volume hologram recording material according to the present exemplary embodiments may be mixed with solvent to prepare a coating liquid, which is then applied to and dried on the support to form the recording layer. On this occasion, any method may be used for the coating. Examples of the method include similar coating methods to the above-described coating methods.

Further, there is not any particular limitation on the kind of the solvent. Usually, it is preferable to use a solvent that has sufficient capability of dissolving the components used, provides an adequate coatability, and is not corrosive to the support.

Examples of the solvent may include a ketone solvent (for example, acetone, methyl ethyl ketone, or cyclohexanone); an aromatic solvent (for example, toluene or xylene); an alcohol solvent (for example, methanol, ethanol, or propanol); a ketone alcohol solvent (for example, diacetone alcohol or 3-hydroxy-3-methyl-2-butanone); an ether solvent (for example, tetrahydrofuran or dioxane); a halogenated solvent (for example, dichloromethane, or chloroform); a cellosolve solvent (for example, methyl cellosolve, ethyl cellosolve, methylcellosolve acetate, or ethyl cellosolve acetate); a propylene glycol solvent (for example, propyleneglycol monomethyl ether, or propyleneglycol monoethyl ether); an ester solvent (for example, ethyl acetate, or butyl acetate); a perfluoroalkyl alcohol solvent (for example, tetrafluoro propanol, or octafluoro pentanol); a highly polar solvent (for example, dimethylformamide, N-methylpyrrolidone, or dimethylsulfoxide); a linear hydrocarbon solvent (for example, n-hexane or n-octane); a cyclic hydrocarbon solvent (for example, cyclohexane or methylcyclohexane); and the mixtures thereof.

Note that, these solvents maybe used solely or in any combination and ratio of two or more kinds.

There is not any particular limitation on the amount of the solvent to be used. However, considering coating efficiency, handling or the like, the amount of the solvent to be used is preferably adjusted in a manner that the solid content concentration of the coating liquid is about 1 wt % or more and about 100 wt % or less.

Further, when a volatile component is less in amount in the volume hologram recording material of the present exemplary embodiments, the volume hologram recording material of the present exemplary embodiments maybe produced by molding such as injection molding or hot pressing, for example.

In this case, when the resultant molding has sufficient thickness, toughness, strength and the like, the molding may be used as it is as the optical recording medium according to the present exemplary embodiment.

Alternatively, after the resin matrix is molded into a desirable shape, additional components and the like maybe impregnated therein so as to produce the recording layer composed of the volume hologram recording material according to the present exemplary embodiments.

The optical recording medium according to the present exemplary embodiments produced in accordance with the procedure described above may be formed into a self-supporting slab or disc and is usable for applications such as three-dimensional image display devices, diffraction optical elements, or large capacity memories.

Both of writing (recording) of information to and reading (reproduction) of information from the optical recording medium of the present exemplary embodiments are performed by light irradiation.

Upon recording information, a beam of light capable of polymerizing the photoactive compound and changing the concentration thereof is used as the object light (also referred to as recording light). In particular, in the optical recording medium of the present exemplary embodiment, because information is recorded in the form of a volume hologram, the recording layer is irradiated with the object light along with the reference light so as to allow the object light and reference light to interfere with each other at the recording layer. The resultant interfering light causes the photoactive compound to be polymerized and causes the concentration thereof to change in the recording layer. As a result, interference patterns develop refractive index difference in the recording layer, whereby the information is recorded in the form of a hologram in the recording layer by the interference patterns that are recorded in the above-mentioned recording layer.

On the other hand, when the volume hologram recorded in the recording layer is reproduced, the recording layer is irradiated with a predetermined reproduction light (usually, the reference light). The reproduction light for irradiation generates diffractions in accordance with the interference patterns. The diffracted light carries the same information as the information recorded in the recording layer, so that the information recorded in the recording layer is reproduced by reading the diffracted light with an appropriate detection unit.

The wavelength region of the object light, reproduction light and reference light is any region respectively in accordance with the use thereof and may be in either a visible region or an ultraviolet region. Preferred examples of these rays of light may include a laser or the like that has excellent monochromaticity and directionality, including a solid laser such as ruby, glass, Nd-YAG, or Nd-YVO$_4$; a diode laser such as GaAs, InGaAs, or GaN; a gas laser such as helium-neon, argon, krypton, excimer, or CO$_2$; and a dye laser having dyes.

The irradiation dose of the object light, reproduction light and reference light has no limitation and is determined optionally within the range where recording and reproduction are attainable. However, when the irradiation dose is extremely small, possibly heat resistance and mechanical properties of the recording layer are not fully exhibited because the chemical change of the photoactive compound (B) is too incomplete. On the other hand, when the irradiation dose is extremely large, possibly the components (the volume hologram recording material according to the present invention) of the recording layer are degraded. Therefore, the irradiation dose of the object light, reproduction light and reference light is in the range of usually 1 mJ/cm$^2$ or more and 20 J/cm$^2$ or less, in accordance with the composition of the volume hologram recording material according to the present exemplary embodiments used for forming the recording layer, the amount and kind of the polymerization initiator, and the like.

As a hologram recording system, there maybe mentioned a polarized collinear hologram recording system, a multiple-angle incidence reference light hologram recording system, and the like, but any recording system may provide good recording quality when the composition for the volume hologram recording layer formation of the present exemplary embodiments is used as a recording medium.

EXAMPLES

Hereinafter, the present invention will be further described in detail with reference to the following examples. However, within the scope of the present invention, it should be construed that the present invention is in no way limited to those examples.
<Sample Preparation of Recording Layer of Volume Hologram Recording Medium>

Example 1

Into a sample bottle 1, 7.892 g of a compound obtained by adding 2-ethylhexanol to a multimer of hexamethylene diisocyanate, 1.667 g of paracumylphenol EO-modified (n≈1) acrylate, 0.083 g of (η5-2,4-cyclopentadien-1-yl)-bis(2,6-difluoro-3-(1H-pyrrol-1-yl)-phenyl)titanium, and 0.0083 g of terpinolene were weighed and stirred until each component was dissolved.

Then, into a sample bottle 2, 7.108 g of polycaprolactone triol having a molecular weight of 500 and 0.003 g of dioctyl tin dilaurate were weighed and stirred until each component was dissolved.

After that, the sample bottles 1 and 2 were put in a bell jar and deaerated for 3 hours under vacuum, and then the liquids in the sample bottles 1 and 2 were mixed and stirred, and further deaerated for several minutes under vacuum in the bell jar.

The above deaerated liquid was cast on an aluminum deposited glass plate (on the side of aluminum deposited) having a 500 μm thick Teflon (registered trademark) sheet as a spacer on the both ends thereof; the liquid cast on the glass plate was further covered with an AR (anti-reflection) coated glass plate in a manner that the AR coated face directed upward; and, after the periphery of the resultant assembly was fixed with clips, the assembly was heated at 60° C. for 15 hours to prepare a recording layer.

Example 2

Similarly to Example 1, into a sample bottle 1, 4.743 g of hexamethylene diisocyanate, 1.667 g of tribromophenylacrylate, 0.083 g of bis(η5-2,4-cyclopentadien-1-yl)-bis(2,6-difluoro-3-(1H-pyrrol-1-yl)-phenyl) titanium, and 0.0083 g of terpinolene were weighed and stirred until each component was dissolved.

Then, into a sample bottle 2, 10.257 g of polycaprolactone triol having a molecular weight of 500 and 0.003 g of dioctyl tin dilaurate were weighed and stirred until each component was dissolved.

Subsequently, a recording layer was prepared by performing the similar procedure to Example 1.

Example 3

Similarly to Example 1, into a sample bottle 1, 7.892 g of a compound obtained by adding 2-ethylhexanol to a multimer of hexamethylene diisocyanate, 1.667 g of tribromophenylacrylate, 0.083 g of bis(η5-2,4-cyclopentadien-1-yl)-bis(2,6-difluoro-3-(1H-pyrrol-1-yl)-phenyl)titanium, and 0.0083 g of γ-terpinene were weighed and stirred until each component was dissolved.

Then, into a sample bottle 2, 7.108 g of polycaprolactone triol having a molecular weight of 500 and 0.003 g of dioctyl tin dilaurate were weighed and stirred until each component was dissolved.

Subsequently, a recording layer was prepared by performing the similar procedure to Example 1.

Comparative Example 1

The similar procedure to Example 1 was carried out to prepare a recording layer, except that terpinolene was not added in Example 1, and to use it for recording.

Comparative Example 2

The similar procedure to Example 2 was carried out to prepare a recording layer, except that terpinolene was not added in Example 2, and to use it for recording.

Example 4

Into a sample bottle 1, 8.418 g of a compound obtained by adding 2-ethylhexanol to a multimer of hexamethylene diisocyanate, 1.778 g of tribromophenylacrylate, 0.089 g of bis(2,4,6-trimethylbenzoyl)-phenylphosphine oxide, and 8.9 mg of terpinolene were weighed and stirred until each component was dissolved.

Then, into a sample bottle 2, 7.582 g of polycaprolactone triol having a molecular weight of 500, 0.0032 g of dioctyl tin dilaurate were weighed and stirred until each component was dissolved.

After that, the sample bottles 1 and 2 were put in a bell jar and deaerated for 3 hours under vacuum, and then the liquids in the sample bottles 1 and 2 were mixed and stirred, and further deaerated for several minutes under vacuum in the bell jar.

Subsequently, the vacuum deaerated liquid was cast on a slide glass having a 500 μm thick Teflon (registered trademark) sheet as a spacer on the both ends thereof; the liquid cast on the slide glass was further covered with another slide glass; and, after the periphery of the resultant assembly was fixed with clips, the assembly was heated at 60° C. for 15 hours to prepare a recording layer.

Example 5

A recording layer was prepared in the similar procedure to Example 4, except that terpinolene was placed by γ-terpinene in Example 4.

Example 6

A recording layer was prepared in the similar procedure to Example 4, except that terpinolene was placed by 1,4-cyclohexadiene in Example 4.

Example 7

Into a sample bottle 1, 2.087 g of hexamethylene diisocyanate, 0.421 g of benzotriazoryl thioethyl acrylate, 0.042 g of bis(2,4,6-trimethylbenzoyl)-phenylphosphine oxide, and 0.42 mg of terpinolene were weighed and stirred until each component was dissolved.

Then, into a sample bottle 2, 5.440 g of polycarbonate polyol having a molecular weight of about 1,000 and composed of 1,5-pentane diol and 1,6-hexane diol in a ratio of 1:1, 0.473 g of trimethylolpropane, and 0.0016 g of dioctyl tin dilaurate were weighed and stirred until each component was dissolved.

After that, the sample bottles 1 and 2 were put in a bell jar and deaerated for 3 hours under vacuum, and then the liquids in the sample bottles 1 and 2 were mixed and stirred, and further deaerated for several minutes under vacuum. The vacuum deaerated liquid was cast on a slide glass having a 500 μm thick Teflon (registered trademark) sheet as a spacer on the both ends thereof; the liquid cast on the slide glass was further covered with another slide glass; and, after the periphery of the resultant assembly was fixed with clips, the assembly was heated at 60° C. for 15 hours to prepare a recording layer.

Example 8

Into a sample bottle 1, 6.21 g of a compound obtained by adding 2-ethylhexanol to a multimer of hexamethylene diisocyanate, 1.667 g of fluorene acrylate (OGSOL EA-0200 (produced by Osaka Gas Chemicals Co., Ltd.)), 0.089 g of bis(2,4,6-trimethylbenzoyl)-phenylphosphine oxide, and 8.3 mg of terpinolene were weighed and stirred until each component was dissolved.

Then, into a sample bottle 2, 8.79 g of polycaprolactone triol having a molecular weight of about 800 and 0.003 g of dioctyl tin dilaurate were weighed and stirred until each component was dissolved.

After that, the sample bottles 1 and 2 were put in a bell jar and deaerated for 3 hours under vacuum, and then the liquids in the sample bottles 1 and 2 were mixed and stirred, and further deaerated for several minutes under vacuum.

Subsequently, the vacuum deaerated liquid was cast on a slide glass having a 500 μm thick Teflon (registered trademark) sheet as a spacer on the both ends thereof; the liquid cast on the slide glass was further covered with another slide glass; and, after the periphery of the resultant assembly was fixed with clips, the assembly was heated at 60° C. for 15 hours to prepare a recording layer.

Example 9

Into a sample bottle 1, 2.785 g of hexamethylene diisocyanate, 0.309 g of tribromophenyl acrylate, 0.031 g of bis(2,4,6-trimethylbenzoyl)-phenylphosphine oxide, and 6.18 mg of methyl linoleate were weighed and stirred until each component was dissolved.

Then, into a sample bottle 2, 6.493 g of polycarbonate polyol that has a molecular weight of about 1,000 and composed of 1,5-pentane diol and 1,6-hexanediol in a ratio of 1:1, 0.721 g of trimethylol propane, and 0.002 g of dioctyl tin dilaurate were weighed and stirred until each component was dissolved.

After that, the sample bottles 1 and 2 were put in a bell jar and deaerated for 3 hours under vacuum, and then the liquids in the sample bottles 1 and 2 were mixed and stirred, and further deaerated for several minutes under vacuum. Subsequently, the vacuum deaerated liquid was cast on a slide glass having a 500 μm thick Teflon (registered trademark) sheet as a spacer on the both ends thereof; the liquid cast on the slide glass was further covered with another slide glass; and, after the periphery of the resultant assembly was fixed with clips, the assembly was heated at 60° C. for 15 hours to prepare a recording layer.

Example 10

Similarly to Example 4, into a sample bottle 1, 8.418 g of a compound obtained by adding 2-ethyl hexanol to a multimer of hexamethylene diisocynate, 1.778 g of paracumylphenol EO-modified (n≈1) acrylate, 0.089 g of bis(2,4,6-trimethylbenzoyl)-phenylphosphine oxide, and 0.0089 g of 1,4-cyclohexadiene were weighed and stirred until each component was dissolved.

Into a sample bottle 2, 7.582 g of polycaprolactone triol having a molecular weight of 500 and 0.0032 g of dioctyl tin dilaurate were weighed and stirred until each component was dissolved.

After that, the similar procedure to Example 4 was carried out to prepare a recording layer.

Comparative Example 3

A recording layer was prepared in the similar procedure to Example 4, except that terpinolene was not added in Example 4.

Comparative Example 4

A recording layer was prepared in the similar procedure to Example 4, except that terpinolene was placed by BHT in Example 4.

Comparative Example 5

Into a sample bottle 1, 2.785 g of hexamethylene diisocyanate, 0.526 g of tribromophenyl acrylate, 0.042 g of bis(2,4,6-trimethylbenzoyl)-phenylphosphine oxide, and 0.618 mg of nitrobenzene were weighed and stirred until each component was dissolved.

Then, into a sample bottle 2, 6.493 g of polycarbonate polyol that has a molecular weight of about 1,000 and composed of 1,5-pentane diol and 1,6-hexanediol in a ratio of 1:1, 0.721 g of trimethylol propane, and 0.002 g of dioctyl tin dilaurate were weighed and stirred until each component was dissolved.

After that, the sample bottles 1 and 2 were put in a bell jar and deaerated for 3 hours under vacuum, and then the liquids in the sample bottles 1 and 2 were mixed and stirred, and further deaerated for several minutes under vacuum.

Subsequently, the vacuum deaerated liquid was cast on a slide glass having a 500 μm thick Teflon (registered trademark) sheet as a spacer on the both ends thereof; the liquid cast on the slide glass was further covered with another slide glass; and, after the periphery of the resultant assembly was fixed with clips, the assembly was heated at 60° C. for 15 hours to prepare a recording layer.

Comparative Example 6

Into a sample bottle 1, 1.501 g of hexamethylene diisocyanate, 0.309 g of tribromophenyl acrylate, 0.062 g of bis(2,4,6-trimethylbenzoyl)-phenylphosphine oxide, and 0.309 mg of terpinolene were weighed and stirred until each component was dissolved.

Then, into a sample bottle 2, 6.751 g of polypropylene diol having a molecular weight of about 1,000, 1.688 g of polypropylene triol (polymerization was initiated with glycerin) having a molecular weight of about 1,000, and 0.002 g of dioctyl tin dilaurate were weighed and stirred until each component was dissolved.

After that, the sample bottles 1 and 2 were put in a bell jar and deaerated for 3 hours under vacuum, and then the liquids in the sample bottles 1 and 2 were mixed and stirred, and further deaerated for several minutes under vacuum. Subsequently, the vacuum deaerated liquid was cast on a slide glass having a 500 μm thick Teflon (registered trademark) sheet as a spacer on the both ends thereof; the liquid cast on the slide glass was further covered with another slide glass; and, after the periphery of the resultant assembly was fixed with clips, the assembly was heated at 60° C. for 15 hours to prepare a recording layer.

<Measurement of Glass Transition Temperature Tg>

Only a hologram recording layer (having a thickness of about 500 μm) was taken out of the sample of the volume hologram recording layer described above, which was then cut into a sample strip having 1 cm width and about 2 cm length. The temperature dependencies of storage elastic modulus (E') and loss elastic modulus (E") of the sample strip were measured with a dynamic viscoelastic spectrometer (DMS-6100, manufactured by SII NanoTechnology Inc.) in a temperature range of from −100° C. to 120° C. at a measurement frequency of 10 Hz. The glass transition temperature Tg of the matrix resin was defined as the temperature at which the ratio of E' and E", that is, E"/E'=tan δ, reaches the maximum.

<Hologram Recording>

Among the samples of the volume hologram recording layers described above, for the samples of Examples 1 to 3 and Comparative Examples 1 and 2 by using a green laser, and for the samples of Examples 4 to 10 and Comparative Examples 3 to 6 by using a blue laser, hologram recording was carried out in accordance with the following procedure so as to evaluate the S/N ratio or the diffraction efficiency ratios.

(1) Green Laser

Data Recording

For a recording medium having a recording layer formed therein in accordance with the procedure described above, information recording was carried out under the following conditions by using a collinear holographic recording media test system (SHOT-1000, manufactured by Pulstec Industrial Co., Ltd.).

The recording medium was fixed on a holder in a manner that laser irradiation at the time of record reproduction was performed from the upper direction (from the upper direction of the AR coated face) of the recording medium, and the position thereof was adjusted in a manner that the laser irradiation was focused on the aluminum deposited layer (reflection layer). Reading was performed 120 seconds after writing. An information pattern equipped with the test system as a standard (a test information pattern with about 1,600 bytes) was used.

(Data Recording Conditions)

Laser wavelength for record reproduction: 532 nm (Nd:YVO$_4$)

Laser intensity for recording: 0.2 mW to 0.4 mW (10 nsec of pulse width; and 50 psec of repetition interval)

Intensity ratio of Information light to reference light=0.63

Recording pulse number: 10 pulses to 10,000 pulses (Data Reading Conditions)

Laser intensity for reading: 0.05 mW to 0.2 mW (10 nsec pulse width; 50 μsec repetition interval; and being adjusted by CMOS image intensity)

Reading pulse number: 10 to 200 pulses

S/N Ratio

The S/N ratio was calculated under the following conditions:

Writing intensity: 0.4 mW, 200 pulses

Reading intensity: 0.05 mW, 200 pulses (2) Blue Laser

Data Recording

FIG. 1 schematically shows an apparatus used for hologram recording.

In FIG. 1, S represents a sample of a volume hologram optical recording medium; M1 to M3, each represent a mirror; PBS represents a polarized beam splitter; L1 represents a laser beam source for recording light having a wavelength of 405 nm; L2 represents a laser beam source for reproduction light having a wavelength of 633 nm; and PD1 and PD2, each represent a photodetector.

A light source for hologram recording that provides a blue color ray of light around 405 nm (a single mode laser diode manufactured by SONY Corp., indicated by "L1" in the figure) was used.

The 405 nm light was split into two beams with the polarized beam splitter (indicated by "PBS" in the figure), and the resultant beams were crossed on a recording face at an angle of 50.00 degrees. At this time, irradiation was performed in a manner that the bisector of the angle between the two beams was oriented perpendicularly to the recording face and that the vibration plane of the electric field vector formed by the two beams obtained by splitting was oriented perpendicularly to the plane that involves the two crossing beams therein.

After a hologram was recorded, the recording face was irradiated with the light emitted from a He—Ne laser (v05-LHP151 manufactured by Melles Griot Corp., indicated by "L2" in the figure) capable of generating a 633 nm light at an angle of 30.19 degrees with respect to the recording face; and the resultant diffracted light was detected with a power meter and a detector (2930-C and 918-SL manufactured by Newport Corp., indicated by "PD1" and "PD2" in the figure, respectively) so as to evaluate whether hologram recording was performed properly or not. The hologram diffraction efficiency is given by the ratio of the diffracted light intensity to the incident light intensity.

Ratio of Diffraction Efficiencies

The ratio R1 between the diffraction efficiency one minute after recording (D/E$_{1min}$) and the diffraction efficiency five minutes after recording (D/E$_{5min}$) was calculated in accordance with an equation R1=(D/E$_{5min}$)/(D/E$_{1min}$).

The ratio R2 between the diffraction efficiency one minute after recording (D/E$_{1min}$) and the diffraction efficiency one day after recording (D/E$_{1day}$) was calculated in accordance with an equation R2=(D/E$_{1day}$)/(D/E$_{1min}$).

The components and the measured values of the matrix Tg (° C.) of above-mentioned Examples 1 to 3 and Comparative Examples 1 and 2 are shown in Table 1-a. The components and the measured values of the matrix Tg (° C.) of Examples 4 to 10 and Comparative Examples 3 to 6 are shown in Table 1-b.

TABLE 1-a

|  | EXAMPLES | | | COMPARATIVE EXAMPLES | |
| --- | --- | --- | --- | --- | --- |
|  | 1 | 2 | 3 | 1 | 2 |
| MATRIX | PCL1 | PCL2 | PCL1 | PCL1 | PCL2 |
| MONOMER | PCP | TBPA | TBPA | PCP | TBPA |
| ADDITIVE (POLYMERIZATION CONTROLLING AGENT) | TERPINOLENE | TERPINOLENE | γ-TERPINENE | NONE | NONE |

TABLE 1-a-continued

|  | EXAMPLES | | | COMPARATIVE EXAMPLES | |
| --- | --- | --- | --- | --- | --- |
|  | 1 | 2 | 3 | 1 | 2 |
| POLYMERIZATION INITIATOR | TITANOCENE | TITANOCENE | TITANOCENE | TITANOCENE | TITANOCENE |
| Tg OF MATRIX (RECORDING LAYER) | 23 | 8 | 23 | 23 | 8 |

TABLE 1-b

|  | EXAMPLES | | | | |
| --- | --- | --- | --- | --- | --- |
|  | 4 | 5 | 6 | 7 | 8 |
| MATRIX | PCL1 | PCL1 | PCL1 | PC | PCL1 |
| MONOMER | TBPA | TBPA | TBPA | BTTEA | OGSOL EA |
| ADDITIVE (POLYMERIZATION) CONTROLLING AGENT) | TERPINOLENE | γ-TERPINENE | 1,4-CYCLO HEXA DIENE | TERPINOLENE | TERPINOLENE |
| POLYMERIZATION INITIATOR | TPO | TPO | TPO | TPO | TPO |
| Tg OF MATRIX (RECORDING LAYER) | 23 | 23 | 23 | 3 | 2 |

|  | EXAMPLES | | COMPARATIVE EXAMPLES | | | |
| --- | --- | --- | --- | --- | --- | --- |
|  | 9 | 10 | 3 | 4 | 5 | 6 |
| MATRIX | PC | PCL1 | PCL1 | PCL1 | PC | PPG |
| MONOMER | TBPA | PCP | TBPA | TBPA | TBPA | TBPA |
| ADDITIVE (POLYMERIZATION) CONTROLLING AGENT) | methyl linoleate | 1,4-CYCLO HEXA DIENE | NONE | BHT | NITRO BENZENE | TERPINOLENE |
| POLYMERIZATION INITIATOR | TPO | TPO | TPO | TPO | TPO | TPO |
| Tg OF MATRIX (RECORDING LAYER) | 3 | 23 | 23 | 23 | 3 | −50 |

The compounds shown in Tables 1-a and 1-b are as follows.

TBPA: tribromophenyl acrylate,

BTTEA: benzothiazoryl thioethyl acrylate,

PCP: paracumylphenol EO-modified acrylate,

PCL1: polycaprolactone-based matrix (hexamethylene diisocyanate multimer+polycaprolactone triol (a molecular weight of 500)), PCL1': polycaprolactone-based matrix (hexamethylene diisocyanate multimer +polycaprolactone triol (a molecular weight of 800)), PCL2: polycaprolactone-based matrix (hexamethylene diisocyanate+polycaprolactone triol), and PC: polycarbonate-based matrix (hexamethylene diisocyanate+polycarbonate polyol composed of 1,5-pentane diol and 1,6-hexane diol+trimethylol propane).

The results of Examples 1 to 3 and Comparative Examples 1 and 2 are shown in Table 2.

TABLE 2

|  | EXAMPLES | | | COMPARATIVE EXAMPLES | |
| --- | --- | --- | --- | --- | --- |
|  | 1 | 2 | 3 | 1 | 2 |
| S/N RATIO | 4.2 | 4.8 | 4.2 | 1.8 | 2.0 |

Writing intensity: 0.4 mW, 200 pulses
Reading intensity: 0.05 mW, 200 pulses

<Evaluation of S/N Ratio>

Table 2 shows that the S/N ratios in Examples 1 to 3 are clearly higher than those in Comparative Examples 1 and 2, and that the volume hologram optical recording media in Examples 1 to 3 are excellent in recording quality.

<Variation and Evaluation of Diffraction Efficiency>

FIG. 2 shows the temporal change of diffraction efficiency after light irradiation in Examples 4 and 5.

FIG. 3 shows the temporal change of diffraction efficiency after light irradiation in Comparative Examples 3 and 4.

In Table 3, R1 values in Examples 4 to 10 and Comparative Examples 3 to 6 are shown. Further, in Table 4, R2 values in Example 4 and Comparative Examples 3 and 6 are shown.

TABLE 3

|  | EXAMPLES | | | | | | | COMPARATIVE EXAMPLES | | | |
|---|---|---|---|---|---|---|---|---|---|---|---|
|  | 4 | 5 | 6 | 7 | 8 | 9 | 10 | 3 | 4 | 5 | 6 |
| RATIO R1 OF DIFFRACTION EFFICIENCIES | 2.1 | 1.9 | 1.9 | 2 | 1.1 | 1.2 | 1.9 | 5.3 | 375.1 | ALMOST IMPOSSIBLE | 1.0 |

TABLE 4

|  | EXAMPLES | COMPARATIVE EXAMPLES | |
|---|---|---|---|
|  | 4 | 3 | 6 |
| RATIO R2 OF DIFFRACTION EFFICIENCIES | 3.5 | 40 | 0.6 |

Tables 3 and 4 show that the ratio R1 of diffraction efficiencies is 4 or less (R1≤4) and the ratio R2 is 0.1 or more and 5 or less (0.1≤R2≤5), indicating that the diffraction efficiency reaches a constant value several minutes after recording and the temporal change of recorded signals is small in Examples 4 to 10.

As compared with this, in Comparative Examples 3 and 4, the ratio R1 of diffraction efficiencies is larger than 4 and the ratio R2 is larger than 5. In Comparative Example 5, signal recording became almost impossible because of addition of nitrobenzene. In Comparative Example 6, since R1 was within the range of 0.1 or more and 4 or less (0.1 R1≤4), the increase of the diffraction efficiency was suppressed. However, the diffraction efficiency lowered with time and lowered greatly after 1 day, that is, the value of R2 lowered below 0.7. It is shown that even though the dark reaction is suppressed, the value of diffraction efficiency does not keep a stable value when the selection of the matrix, monomers and the like is inadequate, and thereby the stability of signal quality is not secured.

As described above, while the present invention is explained in detail with the help of specific embodiments, it is obvious to a person skilled in the art that various changes and modifications maybe made without departing from the intention and scope of the present invention.

This application is based on Japanese Patent Application No. 2006-290539 filed on Oct. 25, 2006 and Japanese Patent Application No. 2006-293232 filed on Oct. 27, 2006, the whole disclosures of which are incorporated by reference herein.

Industrial Applicability

The composition for the volume hologram recording layer formation and the volume hologram recording material using the composition, to which the present invention is applied, are suitably used in applications such as a volume hologram optical recording medium.

DESCRIPTION OF REFERENCE NUMERALS AND SIGNS

Figure 1:
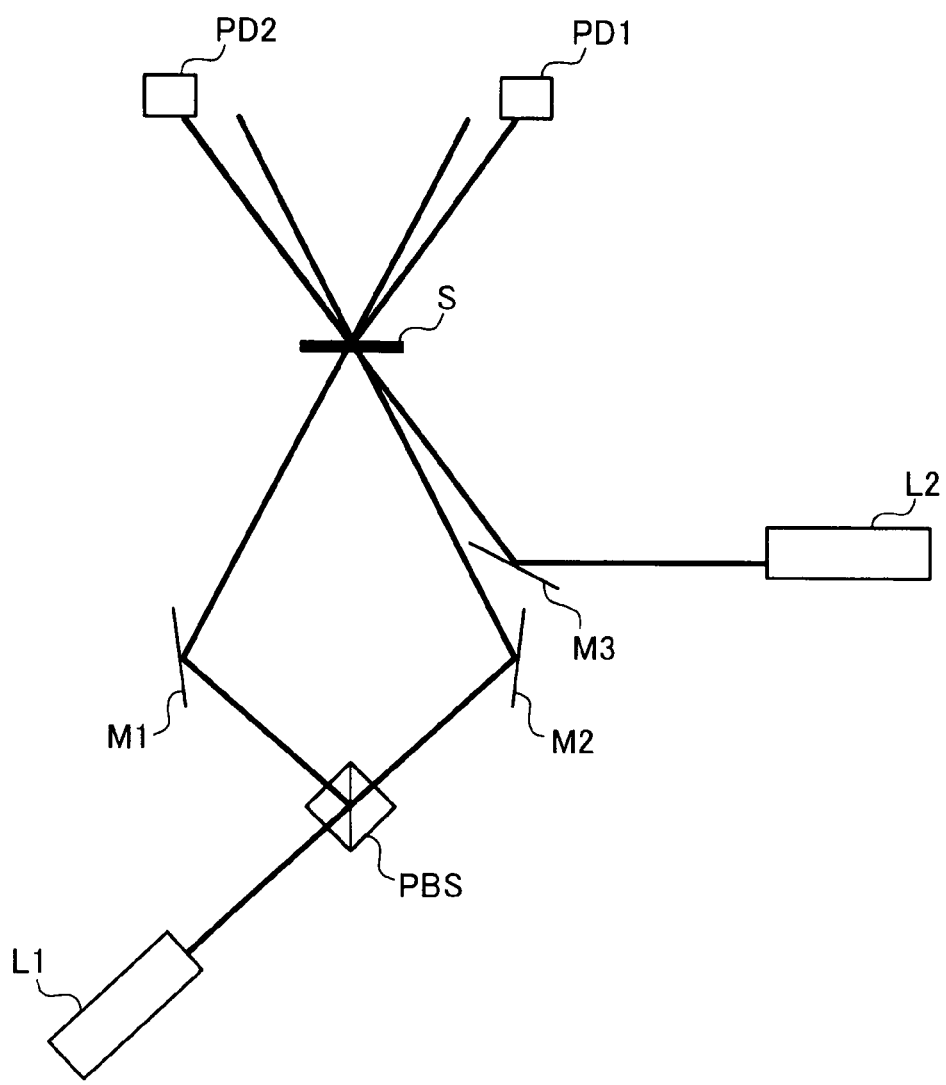
FIG. 1 schematically shows an apparatus used for hologram recording.
Figure 2:
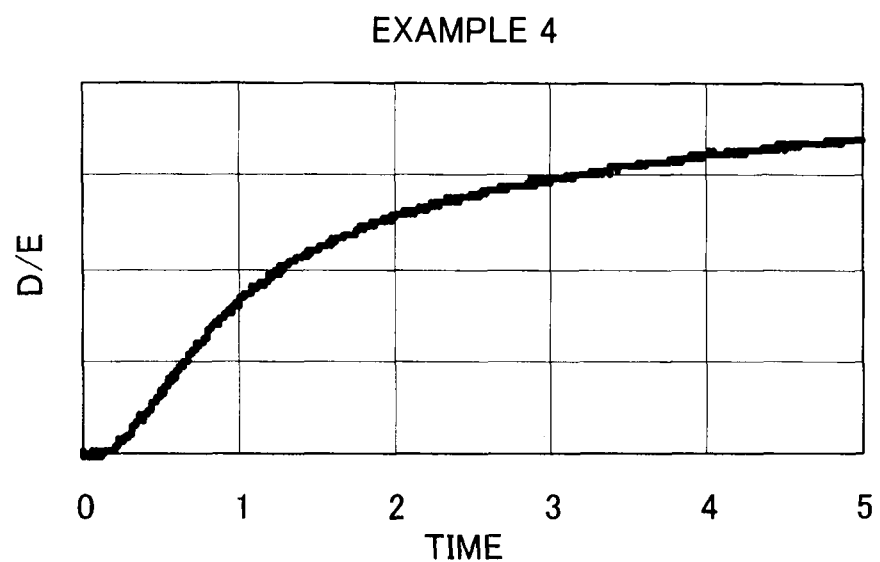
FIG. 2 shows the temporal change of diffraction efficiency after light irradiation in Examples 4 and 5.
Figure 2:
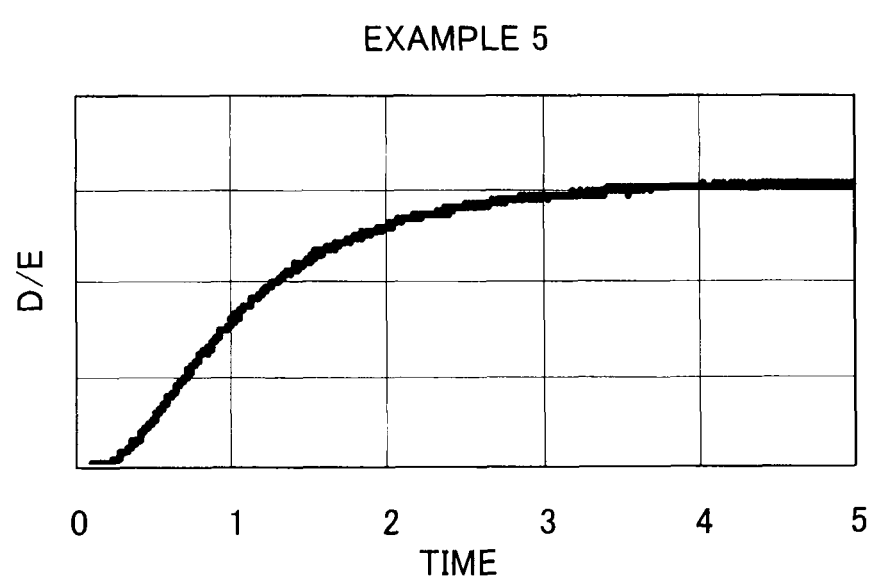
Figure 3:
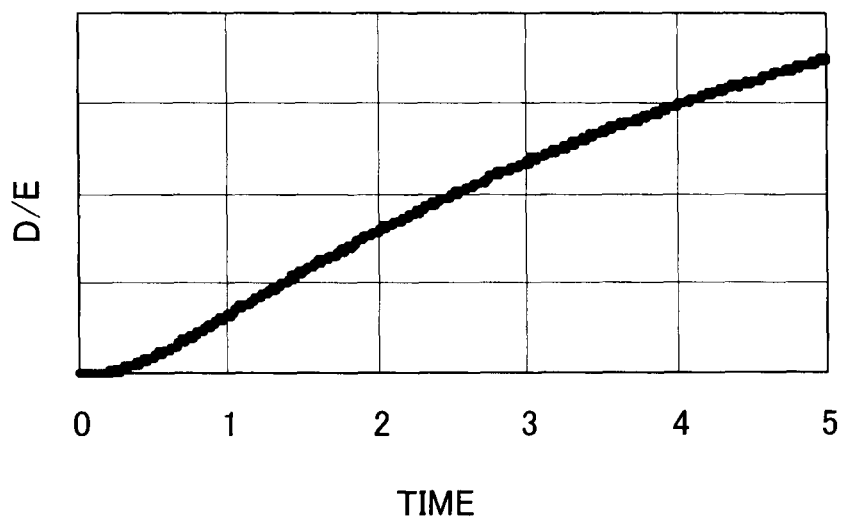
FIG. 3 shows the temporal change of diffraction efficiency after light irradiation in Comparative Examples 3 and 4.
Figure 3:
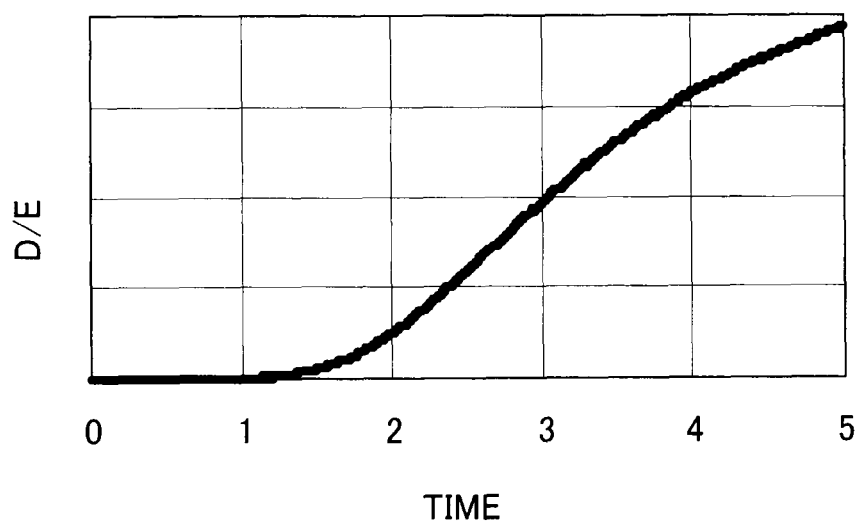

S . . . sample, M1, M2, M3 . . . mirror, PBS . . . polarized beam splitter, L1 . . . laser beam source for recording light, L2 . . . laser beam source for reproduction light, PD1, PD2. Photodetector

The invention claimed is:

1. A volume hologram optical recording medium comprising
a recording layer comprising at least one compound selected from the group consisting of a compound (A1) having a terpenoid structure; a compound (A2) represented by a formula (I):

wherein $R^1$ and $R^2$ each represent an organic group having 1 to 20 carbon atoms, and $R^1$ and $R^2$ may combine to form a ring structure; and a cyclic or non-cyclic compound (A3) having at least two double bonds and two of these double bonds being present at 1 and 4 positions relatively,
a polymerizable photoactive compound (B), and
a resin matrix (C) having a glass transition temperature of Tg of which is in the range of −45° C. or higher, wherein the resin matrix is a three dimensionally cross-linked resin, and
wherein upon volume hologram optical recording, the optical recording medium exhibits a ratio R1 of diffraction efficiency five minutes after a recording with a light irradiation of 10-10,000 pulses of 0.2-0.4 mW of recording light when the light irradiation is ceased to diffraction efficiency one minute after the recording when the light irradiation is ceased, wherein R1 is from 0.1 to 2.1.

2. The volume hologram optical recording medium according to claim 1, wherein the ratio R2 of the diffraction efficiency one day after the recording to the diffraction efficiency one minute after the recording is in a range of 0.7 or more and 4 or less.

3. The volume hologram optical recording medium according to claim 1, wherein the compound (A1) having a terpenoid structure is selected from the group consisting of terpinolene, α-terpinene, β-terpinene and γ-terpinene.

4. The volume hologram optical recording medium according to claim 1, wherein the cyclic or non-cyclic compound (A3) having at least two double bonds and two of these double bonds being present at 1 and 4 positions relatively is selected from the group consisting of 1,4-cyclohexadiene, 1,4-cycloheptadiene, linoleic acid or the derivatives thereof, and linolenic acid or the derivatives thereof.

5. The volume hologram optical recording medium according to claim 1, wherein the recording layer comprises a monoterpene selected from the group consisting of camphor, menthol, limonene, terpinerol, geraniol, nerol, and citronellol.

6. The volume hologram optical recording medium according to claim 1, wherein the recording layer comprises a compound (A3) selected from the group consisting of 1,2-dimethyl-1,4-cyclohexadiene, 1-ethyl-1,4-cyclohexadiene, 1-propyl-1,4-cyclohexadiene, 1-phenyl-1,4-cyclohexadiene, 1-methoxy-1,4-cyclohexadiene, 1-aceto-1,4-cyclohexadiene, 1-chloro-1,4-cyclohexadiene, 1-bromo-1,4-cyclohexadiene, 4,7-dihydroindane, 1,2,3,4,5,8-hexahydronaphthalene, 1,4-cycloheptadiene, 1,4-cyclooctadiene, 1,4-heptadiene, 1,4-hexadiene, 2-methyl-1,4-pentadiene, 3,6-nonanediene-1-ol, 9,12-octadecadienol, linolenic acid, γ-linolenic acid, linoleic acid, eicosapentaenoic acid, docosahexaenoic acid and derivatives thereof.

7. The volume hologram optical recording medium according to claim 1, wherein the recording layer comprises a compound (A2) selected from the group consisting of 2,3,4-trimethyl-2-pentene, 2,3-dimethyl-2-butene, 6,6-dimethyl fulvene, isopropylidene malonic acid diethyl ester, and 5-methyl-2-(1-methylethylidene)-cyclohexanone.

8. A composition for volume hologram recording layer formation for use in a volume hologram optical recording medium, comprising:
    a polymerizable photoactive compound (B) comprising a system capable of forming an optical image;
    a resin matrix (C) having a glass transition temperature of Tg of which is in the range of −45° C. or higher, wherein the resin matrix is a three dimensionally cross-linked resin; and
    at least one compound that is added to the system, and that is selected from the group consisting of a compound (A1) having a terpenoid structure, a compound (A2) represented by a formula (I):

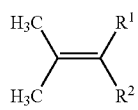

wherein $R^1$ and $R^2$ each represent an organic group having 1 to 20 carbon atoms, and $R^1$ and $R^2$ may combine to form a ring structure; and a cyclic or non-cyclic compound (A3) having at least two double bonds, two of these double bonds being present at 1 and 4 positions relatively, wherein upon volume hologram optical recording, the optical recording medium exhibits a ratio R1 of diffraction efficiency five minutes after a recording with a light irradiation of 10-10,000 pulses of 0.2-0.4 mW of recording light when the light irradiation is ceased to diffraction efficiency one minute after the recording when the light irradiation is ceased, wherein R1 is from 0.1 to 2.1.

9. The composition for the volume hologram recording layer formation according to claim 8, wherein the compound (A1) having a terpenoid structure is selected from the group consisting of terpinolene, α-terpinene, β-terpinene and γ-terpinene.

10. The composition for the volume hologram recording layer formation according to claim 8, wherein the cyclic or non-cyclic compound (A3) having at least two double bonds and two of these double bonds being present at 1 and 4 positions relatively is selected from the group consisting of 1,4-cyclohexadiene, and 1,4-cycloheptadiene.

11. The composition for the volume hologram recording layer formation according to claim 8, further comprising:
    a photopolymerization initiator (D).

12. The composition for the volume hologram recording layer formation according to claim 8, wherein the polymerizable photoactive compound (B) is a radical polymerizable monomer.

13. A volume hologram recording material, comprising:
the composition for the volume hologram recording layer formation according to claim 8.

14. A volume hologram optical recording medium, comprising:
    a layer comprising the volume hologram recording material according to claim 13.

15. The composition for the volume hologram recording layer formation according to claim 8, wherein the composition comprises a monoterpene selected from the group consisting of camphor, menthol, limonene, terpinerol, geraniol, nerol, and citronellol.

16. The composition for the volume hologram recording layer formation according to claim 8, wherein the composition comprises a compound (A3) selected from the group consisting of 1,2-dimethyl-1,4-cyclohexadiene, 1-ethyl-1,4-cyclohexadiene, 1-propyl-1,4-cyclohexadiene, 1-phenyl-1,4-cyclohexadiene, 1-methoxy-1,4-cyclohexadiene, 1-aceto-1,4-cyclohexadiene, 1-chloro-1,4-cyclohexadiene, 1-bromo-1,4-cyclohexadiene, 4,7-dihydroindane, 1,2,3,4,5,8-hexahydronaphthalene, 1,4-cycloheptadiene, 1,4-cyclooctadiene, 1,4-heptadiene, 1,4-hexadiene, 2-methyl-1,4-pentadiene, 3,6-nonanediene-1-ol, 9,12-octadecadienol, linolenic acid, γ-linolenic acid, linoleic acid, eicosapentaenoic acid, docosahexaenoic acid and derivatives thereof.

17. The composition for the volume hologram recording layer formation according to claim 8, wherein the composition comprises a compound (A2) selected from the group consisting of 2,3,4-trimethyl-2-pentene, 2,3-dimethyl-2-butene, 6,6-dimethyl fulvene, isopropylidene malonic acid diethyl ester, and 5-methyl-2-(1-methylethylidene)-cyclohexanone.

* * * * *